(12) United States Patent
Kong et al.

(10) Patent No.: US 12,033,986 B2
(45) Date of Patent: Jul. 9, 2024

(54) LIGHT-EMITTING DEVICE AND DISPLAY DEVICE INCLUDING SAME

(71) Applicant: SAMSUNG DISPLAY CO., LTD., Yongin-si (KR)

(72) Inventors: Tae Jin Kong, Yongin-si (KR); Hee Keun Lee, Yongin-si (KR); Xinxing Li, Yongin-si (KR); Hyun Min Cho, Yongin-si (KR); Dae Hyun Kim, Yongin-si (KR); Myeong Hee Kim, Yongin-si (KR); Veidhes Basrur, Yongin-si (KR); Chang Il Tae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 752 days.

(21) Appl. No.: 17/261,414

(22) PCT Filed: Jan. 18, 2019

(86) PCT No.: PCT/KR2019/000796
§ 371 (c)(1),
(2) Date: Jan. 19, 2021

(87) PCT Pub. No.: WO2020/017719
PCT Pub. Date: Jan. 23, 2020

(65) Prior Publication Data
US 2021/0265324 A1    Aug. 26, 2021

(30) Foreign Application Priority Data

Jul. 20, 2018   (KR) .................. 10-2018-0084728

(51) Int. Cl.
*H01L 25/075*   (2006.01)
*H01L 33/62*    (2010.01)

(52) U.S. Cl.
CPC .......... *H01L 25/0753* (2013.01); *H01L 33/62* (2013.01); *H01L 2933/0066* (2013.01)

(58) Field of Classification Search
CPC .... H01L 27/156; H01L 25/0753; H01L 33/62
See application file for complete search history.

(56) References Cited

U.S. PATENT DOCUMENTS 9,329,433 B2    5/2016  Negishi et al.
10,109,658 B2   10/2018 Jeong et al.
(Continued)

FOREIGN PATENT DOCUMENTS

JP    2012-4535    1/2012
KR    10-1672781   11/2016
(Continued)

OTHER PUBLICATIONS

International Search Report, with English translation, corresponding to International Application No. PCT/KR2019/000796 dated Apr. 23, 2019.
(Continued)

*Primary Examiner* — Robert G Bachner
*Assistant Examiner* — Molly K Reida
(74) *Attorney, Agent, or Firm* — KILE PARK REED & HOUTTEMAN PLLC

(57) ABSTRACT

A light emitting device may include: a substrate including emission areas; a first electrode disposed on the substrate; a second electrode disposed on the substrate and spaced apart from the first electrode; light emitting elements disposed on the substrate, each of the light emitting elements including a first end and a second end in a longitudinal direction of the light emitting elements; a bank disposed in each of the emission areas and including openings in which portions of each of the unit emission areas are exposed; a first contact electrode that electrically connects the first electrode with (Continued)

the first end of each of the light emitting elements; and a second contact electrode that electrically connects the second electrode with the second end of each of the light emitting elements. At least one of the light emitting elements may be disposed in each of the openings.

18 Claims, 23 Drawing Sheets

(56) References Cited

U.S. PATENT DOCUMENTS

| | | | |
|---|---|---|---|
| 10,367,123 | B2 | 7/2019 | Im et al. |
| 10,461,123 | B2 | 10/2019 | Kim et al. |
| 10,672,946 | B2 | 6/2020 | Cho et al. |
| 2017/0162553 | A1 | 6/2017 | Bibl et al. |
| 2017/0317228 | A1 | 11/2017 | Sung |
| 2018/0138157 | A1 | 5/2018 | Im et al. |
| 2018/0175009 | A1* | 6/2018 | Kim .................. H01L 25/0753 |
| 2018/0287010 | A1 | 10/2018 | Sung |
| 2019/0019930 | A1 | 1/2019 | Do et al. |
| 2019/0326348 | A1 | 10/2019 | Im et al. |
| 2020/0013766 | A1* | 1/2020 | Kim ...................... H01L 25/167 |

FOREIGN PATENT DOCUMENTS

| | | |
|---|---|---|
| KR | 10-1711187 | 3/2017 |
| KR | 10-1713818 | 3/2017 |
| KR | 10-2017-0104086 | 9/2017 |
| KR | 10-2018-0007376 | 1/2018 |
| KR | 10-2018-0055021 | 5/2018 |
| KR | 10-2018-0072909 | 7/2018 |
| KR | 10-2018-0081378 | 7/2018 |
| KR | 10-2019-0121894 | 10/2019 |
| KR | 10-2019-0124359 | 11/2019 |

OTHER PUBLICATIONS

Written Opinion, with English translation, corresponding to International Application No. PCT/KR2019/000796, dated Apr. 23, 2019.

* cited by examiner

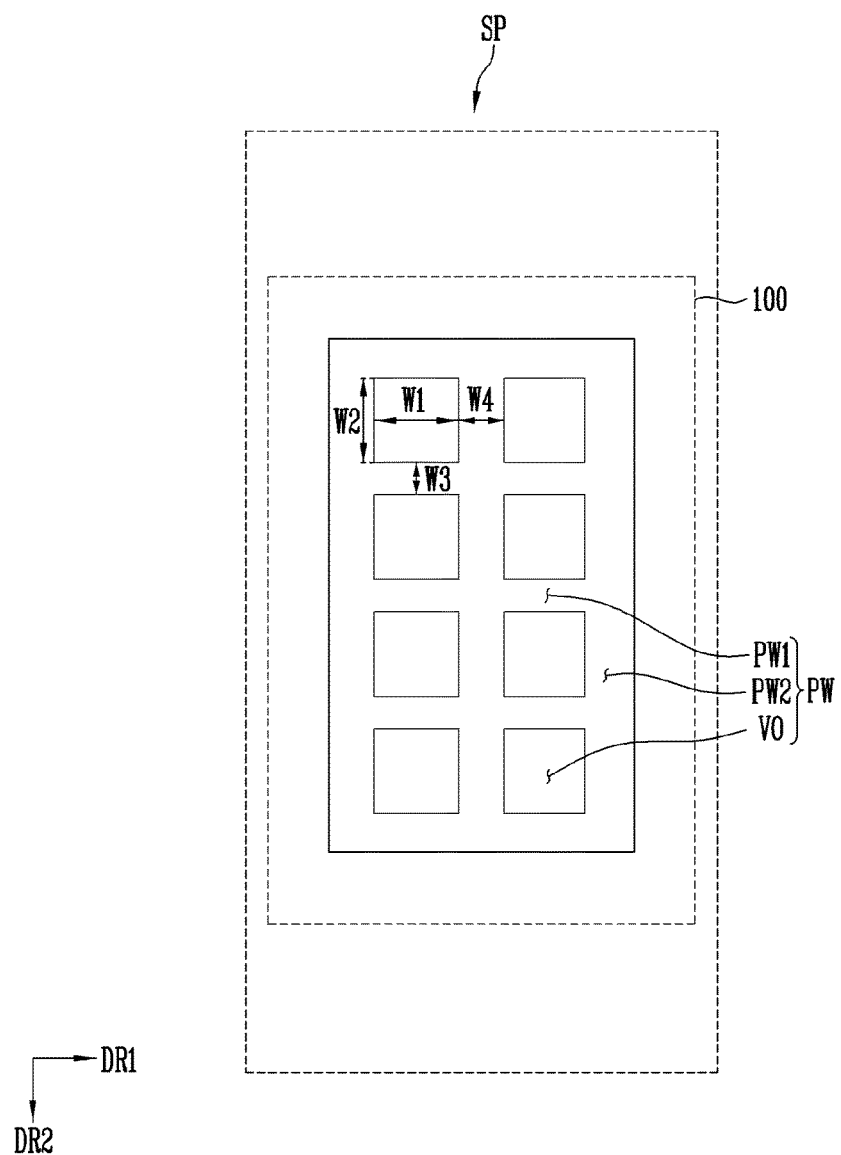

LIGHT-EMITTING DEVICE AND DISPLAY DEVICE INCLUDING SAME

CROSS-REFERENCE TO RELATED APPLICATIONS

This application is a national entry ofigf International Application No. PCT/KR2019/000796, filed on Jan. 18, 2019, which claims under 35 U.S.C. § 119(a) and 365(b) priority to and benefits of Korean Patent Application No. 10-2018-0084728, filed on Jul. 20, 2018 in the Korean Intellectual Property Office, the entire contents of which are incorporated herein by reference.

BACKGROUND

1. Technical Field

Various embodiments of the disclosure relate to a light emitting device and a display device having the light emitting device.

2. Description of Related Art

A light emitting diode (hereinafter, referred to as "LED") may have relatively satisfactory durability even under poor environmental conditions and may have excellent performances in terms of lifetime and luminance.

To apply the LED to a lighting device, a display device, or the like, there is a need to connect the LED to an electrode so that the voltage of the power supply may be applied to the LED. With regard to application purposes of the LED, a method of reducing a space needed for the electrode, or a method of fabricating the LED, various researches on arrangement relationship between the LED and the electrode have been conducted.

Schemes for arranging the LED and electrode may be classified into a scheme of directly growing the LED on the electrode, and a scheme of independently growing the LED and then disposing the LED on the electrode.

In the case of the latter scheme, in case that the LED is a nanoscale subminiature diode, there is a problem in that it is difficult to dispose the LED on the electrode.

SUMMARY

Various embodiments of the disclosure relate to a light emitting device in which the light emitting efficiency of a subminiature light emitting diode can be enhanced, and a display device having the light emitting device.

According to an aspect of the disclosure, a light emitting device may include a substrate including a plurality of emission areas; a first electrode disposed on the substrate; a second electrode disposed on the substrate and spaced apart from the first electrode; a plurality of light emitting elements disposed on the substrate, each of the plurality of light emitting elements including a first end and a second end in a longitudinal direction of the plurality of light emitting elements; a partition wall (or a bank) disposed in each of the plurality of emission areas, and including a plurality of openings in which portions of plurality of emission areas are exposed; a first contact electrode that electrically connects the first electrode with the first end of each of the plurality of light emitting elements; and a second contact electrode that electrically connects the second electrode with the second end of each of the plurality of light emitting elements. At least one of the light emitting elements may be disposed in each of the plurality of openings.

In an embodiment of the disclosure, the partition wall may include a plurality of first partition walls extending in a first direction; and a plurality of second partition walls extending in a second direction intersecting the first direction. Each of the plurality of openings may include an area formed between a part of the first partition walls and a part of the second partition walls.

In an embodiment of the disclosure, the partition wall may have a mesh shape in a plan view.

In an embodiment of the disclosure, the plurality of openings may be disposed between the first electrode and the second electrode, in a plan view.

In an embodiment of the disclosure, the at least one of the plurality of light emitting elements may be aligned on the substrate in each of the plurality of openings by an electric field formed between the first electrode and the second electrode.

In an embodiment of the disclosure, a lateral width and a longitudinal width of each of the plurality of openings may be greater than a length of each of the plurality of light emitting elements.

In an embodiment of the disclosure, the plurality of second partition walls may overlap each of the first and the second electrodes, in a plan view.

Each of the first electrode and the second electrode may be disposed on a second partition wall of the plurality of the second partition walls corresponding to each of the first electrode and the second electrode.

The first electrode and the second electrode may be disposed on a same layer and spaced apart from each other.

In an embodiment of the disclosure, a second partition wall of the plurality of second partition walls may overlap the first electrode, in a plan view.

The first electrode and the second electrode may be disposed on different layers and spaced apart from each other.

In an embodiment of the disclosure, each of the plurality of light emitting elements may include a first conductive semiconductor layer (or a first semiconductor layer) doped with a first conductive dopant; a second conductive semiconductor layer (or a second semiconductor layer) doped with a second conductive dopant; and an active layer disposed between the first conductive semiconductor layer and the second conductive semiconductor layer.

In an embodiment of the disclosure, each of the plurality of light emitting elements may include a light emitting diode having a shape of a cylinder or polyprism having a micro-scale or nano-scale size.

According to an aspect of the disclosure, a display device may include a substrate including a display area and a non-display area; and a plurality of pixels disposed in the display area, and each of the plurality of pixels including a plurality of sub-pixels. Each of the plurality of sub-pixels may include a pixel circuit layer including at least one transistor; and a display element layer including an emission area through which light is emitted.

In an embodiment of the disclosure, the display element layer may include a first electrode disposed on the pixel circuit layer; a second electrode disposed at a position spaced apart from the first electrode; a plurality of light emitting elements disposed on the pixel circuit layer, and each of the plurality of light emitting elements including a first end and a second end in a longitudinal direction of the plurality of light emitting elements; a partition wall disposed on the pixel circuit layer, and including a plurality of openings in which portions of the emission area of each of the plurality of sub-pixels are exposed; a first contact electrode that electrically connects the first electrode with the first end of each of the plurality of light emitting elements; and a second contact electrode that electrically connects the second electrode with the second end of each of the plurality of light emitting elements. At least one of the plurality of light emitting elements may be disposed in each of the plurality of openings.

In an embodiment of the disclosure, the partition wall may include a plurality of first partition walls extending in a first direction; and a plurality of second partition walls extending in a second direction intersecting the first direction. Each of the plurality of openings may include an area formed between a part of the plurality of first partition walls and a part of the plurality of second partition walls.

In an embodiment of the disclosure, the partition wall may have a mesh shape, in a plan view.

In an embodiment of the disclosure, the plurality of openings may be disposed between the first electrode and the second electrode, in a plan view.

In an embodiment of the disclosure, the at least one of the plurality of light emitting elements may be aligned on the pixel circuit layer in each of the plurality of openings by an electric field formed between the first electrode and the second electrode.

In an embodiment of the disclosure, a lateral width and a longitudinal width of each of the plurality of openings may be greater than a length of each of the plurality of the light emitting elements.

In an embodiment of the disclosure, the first electrode and the second electrode may overlap the partition wall in the emission area of each of the plurality of sub-pixels.

Various embodiments of the disclosure may provide a light emitting device having enhanced light emitting efficiency, and a display device having the light emitting device.

DETAILED DESCRIPTION OF THE EMBODIMENTS

An additional appreciation according to the embodiments of the invention will become more apparent by describing in detail the embodiments thereof with reference to the accompanying drawings, wherein:

Each of FIGS. 1A and 1B is a schematic perspective diagram illustrating a light emitting element in accordance with an embodiment of the disclosure.

FIGS. 4A to 4G are schematic plan diagrams sequentially illustrating a method of fabricating the light emitting device of FIG. 2.

DETAILED DESCRIPTION OF THE EMBODIMENTS

Figure 1A:
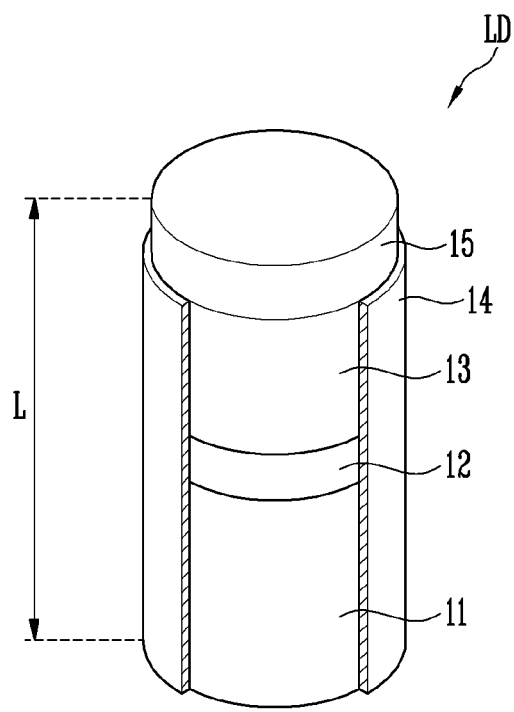

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," or the like, as used herein, specify the presence of stated features, integers, steps, operations, elements, components, and/or combinations of them but do not preclude the presence or addition of one or more other features, integers, steps, operations, elements, components, and/or combinations thereof. When a first part such as a layer, a film, a region, or a plate is disposed on a second part, the first part may be not only directly on the second part but a third part may intervene between them. When it is expressed that a first part such as a layer, a film, a region, or a plate is formed (or disposed) on a second part, the surface of the second part on which the first part is formed is not limited to an upper surface of the second part but may include other surfaces such as a side surface or a lower surface of the second part. When a first part such as a layer, a film, a region, or a plate is disposed under a second part, the first part may be not only directly under the second part but a third part may intervene between them.

Embodiments of the disclosure will hereinafter be described in detail with reference to the accompanying drawings.

Figure 1B:
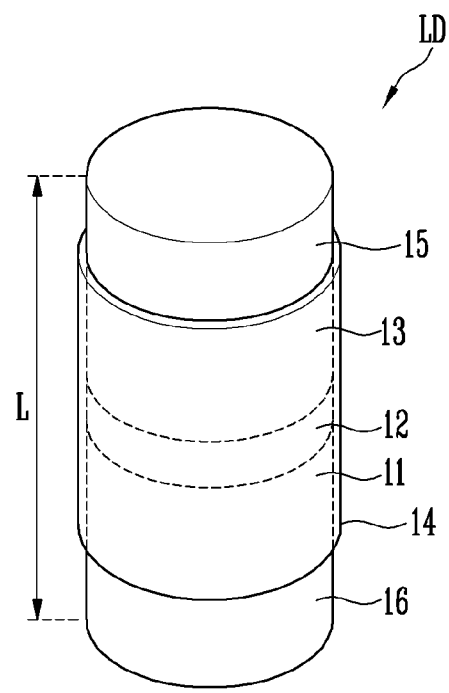

FIGS. 1A and 1B are perspective views illustrating various types of light emitting elements in accordance with embodiments of the disclosure. Although FIGS. 1A and 1B illustrate a cylindrical light emitting element, the disclosure is not limited thereto.

Referring to FIGS. 1A and 1B, a light emitting element LD in accordance with an embodiment of the disclosure may include a first conductive semiconductor layer 11, a second conductive semiconductor layer 13, and an active layer 12 interposed between the first and second conductive semiconductor layers 11 and 13.

For example, the light emitting element LD may be implemented as a stacked body formed by successively stacking the first conductive semiconductor layer 11, the active layer 12, and the second conductive semiconductor layer 13.

In an embodiment of the disclosure, the light emitting element LD may be provided in the form of a rod extending in one direction. If the direction in which the light emitting element LD extends is defined as a longitudinal direction, the light emitting element LD may have a first end and a second end in the longitudinal direction.

One of the first and second conductive semiconductor layers 11 and 13 may be disposed on the first end of the light emitting element LD, and the other of the first and second conductive semiconductor layers 11 and 13 may be disposed on the second end of the light emitting element LD.

Although the light emitting element LD may be provided in the form of a cylinder, the disclosure is not limited thereto. The light emitting element LD may have a rod-like shape or a bar-like shape extending in the longitudinal direction (i.e., to have an aspect ratio greater than 1). For example, a length L of the light emitting element LD in the longitudinal direction may be greater than the diameter thereof.

The light emitting element LD may include a light emitting diode fabricated in a subminiature size having a diameter and/or length corresponding, e.g., a micro-scale or nano-scale size.

However, the size of the light emitting element LD is not limited to this, and the size of the light emitting element LD may be changed to meet requirements of a lighting device or a self-emissive display device to which the light emitting element LD is applied.

The first conductive semiconductor layer 11 may include, e.g., at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn.

The material forming the first conductive semiconductor layer 11 is not limited to this, and the first conductive semiconductor layer 11 may be formed of various other materials.

The active layer 12 may be formed on the first conductive semiconductor layer 11 and have a single- or multi-quantum well structure. In an embodiment of the disclosure, a cladding layer (not shown) doped with a conductive dopant may be formed on and/or under the active layer 12. For example, the cladding layer may be formed of an AlGaN layer or an InAlGaN layer. Material such as AlGaN or AlInGaN may be employed to form the active layer 12.

If an electric field of a voltage equal to or greater than a predetermined voltage is applied to the opposite ends of the light emitting element LD, the light emitting element LD emits light by coupling of electron-hole pairs in the active layer 12.

The second conductive semiconductor layer 13 may be provided on the active layer 12 and may include a semiconductor layer having a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg.

The material forming the second conductive semiconductor layer 13 is not limited to this, and the second conductive semiconductor layer 13 may be formed of various other materials.

In an embodiment of the disclosure, the light emitting element LD may further include one electrode layer 15 disposed on the second conductive semiconductor layer 13, as illustrated in FIG. 1A, as well as including the first conductive semiconductor layer 11, the active layer 12, and the second conductive semiconductor layer 13. In an embodiment, as shown in FIG. 1B, the light emitting element LD may further include another electrode layer 16 disposed on one end of the first conductive semiconductor layer 11 as well as including the electrode layer 15.

Although each of the electrode layers 15 and 16 may be formed of an ohmic contact electrode, the disclosure is not limited thereto. Each of the electrode layers 15 and 16 may include metal or a metal oxide. For example, chromium (Cr), titanium (Ti), aluminum (Al), gold (Au), nickel (Ni), ITO, and an oxide or alloy thereof may be used alone or in combination with each other. However, the disclosure is not limited to this.

Materials included in the respective electrode layers 15 and 16 may be identical to or different from each other.

The electrode layers 15 and 16 may be transparent or semitransparent. Therefore, light generated from the light emitting element LD may pass through the electrode layers 15 and 16 and then be emitted outside the light emitting element LD.

In an embodiment of the disclosure, the light emitting element LD may further include an insulating film 14. In an embodiment of the disclosure, the insulating film 14 may be omitted, or may be provided to cover only some of the first conductive semiconductor layer 11, the active layer 12, and the second conductive semiconductor layer 13.

As illustrated in FIG. 1A, the insulating film 14 may be provided on a portion of the light emitting element LD at least other than one of opposite ends of the light emitting element LD. In this case, the insulating film 14 may expose only the one electrode layer 15 disposed on one end of the second conductive semiconductor layer 13 of the light emitting element LD and may enclose the overall side surfaces of the components at least other than the electrode layer 15. The insulating film 14 may allow at least the opposite ends of the light emitting element LD to be exposed to the outside. For example, the insulating film 14 may allow not only the electrode layer 15 disposed on one end of the second conductive semiconductor layer 13 but also one end of the first conductive semiconductor layer 11 to be exposed to the outside.

In an embodiment, as shown in FIG. 1B, in the case where the electrode layers 15 and 16 are disposed on the respective opposite ends of the light emitting element LD, the insulating film 14 may allow at least a portion of each of the electrode layers 15 and 16 to be exposed to the outside. In an embodiment, the insulating film 14 may not be provided.

In an embodiment of the disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film 14 is provided on the light emitting element LD, the active layer 12 may be prevented from short-circuiting with a first electrode and/or a second electrode which is not illustrated.

Thanks to the insulating film 14, occurrence of a defect on the surface of the light emitting element LD may be minimized, and the lifetime and efficiency of the light emitting element LD may be improved. In the case where multiple light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process.

Figure 2:
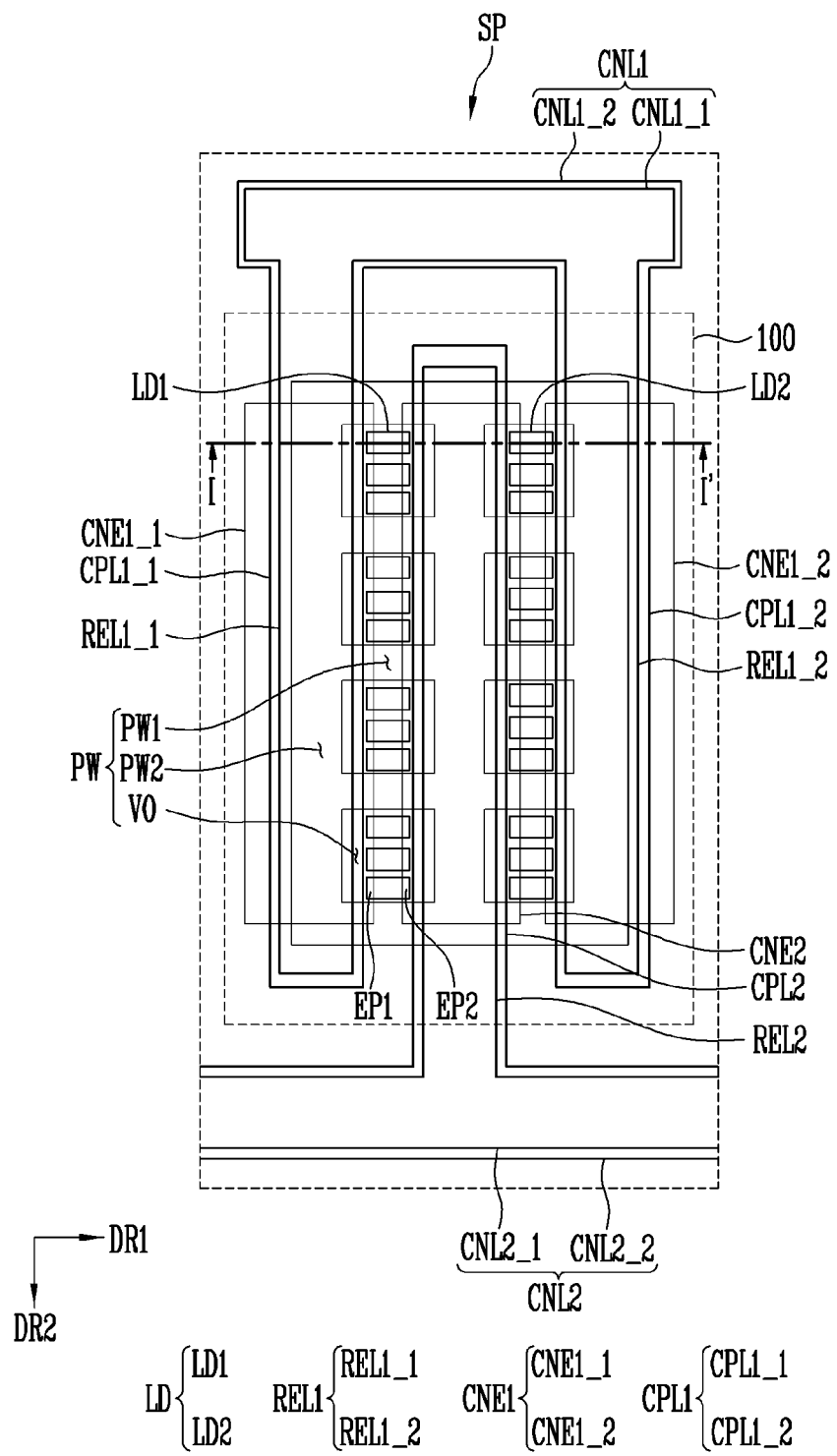
FIG. 2 is a schematic plan diagram illustrating an emission area of a light emitting device including a light emitting element of FIG. 1A.
Figure 3A:
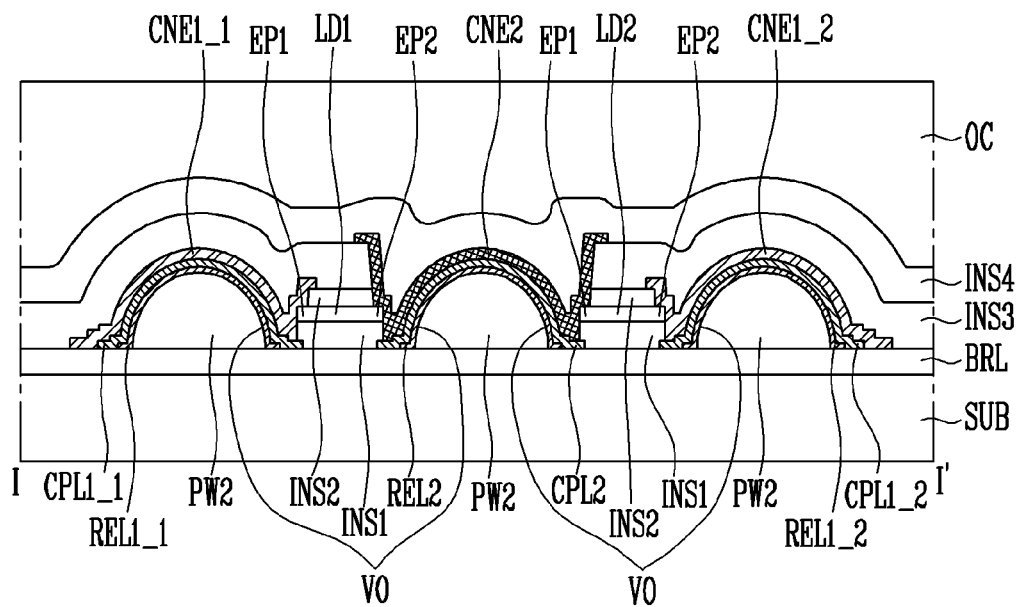
FIG. 3A is a schematic sectional diagram taken along line I-I' of FIG. 2.
Figure 3B:
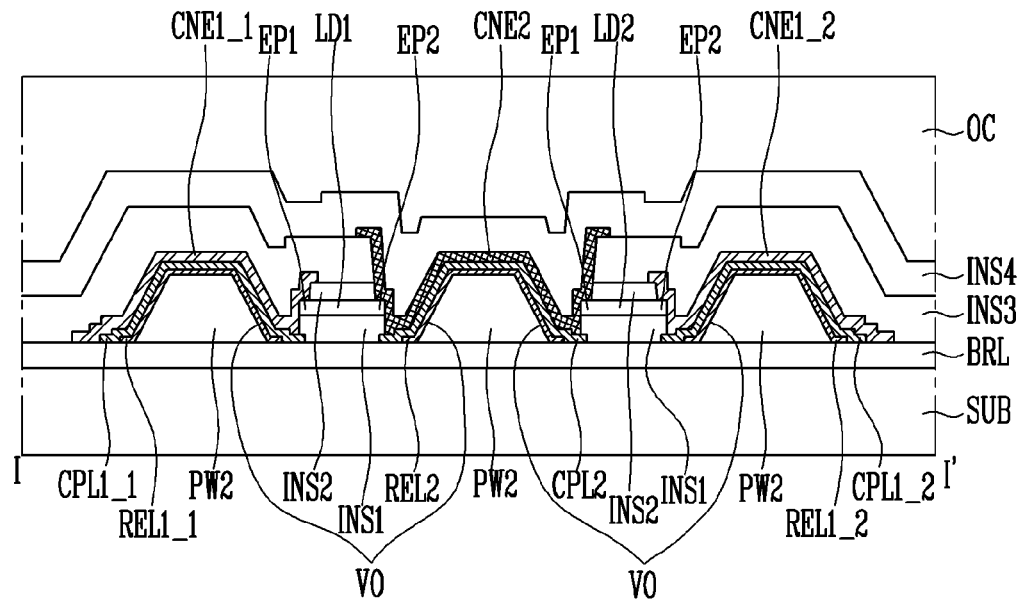
FIG. 3B illustrates a light emitting device in accordance with an embodiment of the disclosure and is a schematic sectional diagram corresponding to line I-I' of FIG. 2.

FIG. 2 is a schematic plan diagram illustrating an emission area of a light emitting device including the light emitting element of FIG. 1A. FIG. 3A is a schematic sectional diagram taken along line I-I' of FIG. 2. FIG. 3B illustrates a light emitting device in accordance with an embodiment of the disclosure, and is a schematic sectional diagram corresponding to line I-I' of FIG. 2.

Although for the sake of convenience, FIG. 2 illustrates that a plurality of light emitting elements are aligned in a horizontal direction, the alignment of the light emitting elements is not limited thereto. In some embodiments, the light emitting elements may be aligned in a direction intersecting the horizontal direction.

In FIG. 2, the emission area may be, for example, a unit emission area which is a pixel area of one of the sub-pixels included in an emission display panel.

Referring to FIGS. 1A, 2, 3A, and 3B, the light emitting device in accordance with an embodiment of the disclosure may include a substrate SUB on which at least one sub-pixel SP having a unit emission area 100 is provided, and light emitting elements LD provided on the substrate SUB.

The substrate SUB may include an insulating material such as glass, an organic polymer, or crystal. The substrate SUB may be made of material having flexibility so as to be bendable or foldable and may have a single-layer or multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may vary.

A barrier layer BRL for preventing impurities from diffusing into the light emitting elements LD may be provided on the substrate SUB.

In an embodiment of the disclosure, each of the light emitting elements LD may be formed of a light emitting diode which is made of material having an inorganic crystal structure and has a subminiature size (e.g., corresponding to a nano or micro scale size).

Each of the light emitting elements LD may include a first conductive semiconductor layer 11, a second conductive semiconductor layer 13, and an active layer 12 interposed between the first and second conductive semiconductor layers 11 and 13. In some embodiments, each of the light emitting elements LD may further include an electrode layer 15 provided on one side of the second conductive semiconductor layer 13.

Each of the light emitting elements LD may include a first end EP1 and a second end EP2. One of the first and second conductive semiconductor layers 11 and 13 may be disposed on the first end EP1, and the other of the first and second conductive semiconductor layers 11 and 13 may be disposed on the second end EP2. In an embodiment of the disclosure, each of the light emitting elements LD may emit any one light of color light and/or white light.

A second insulating layer INK for covering a portion of an upper surface of each of the light emitting elements LD may be provided on the light emitting elements LD. Hence, the opposite ends EP1 and EP2 of each of the light emitting elements LD may be exposed to the outside.

A first insulating layer INS1 may be provided under each of the light emitting elements LD. The first insulating layer INS1 may fill in a space between the substrate SUB and each of the light emitting elements LD to stably support the light emitting elements LD and prevent the light emitting elements LD from being removed from the substrate SUB. The first insulating layer INS1 may be formed of an inorganic insulating layer including inorganic material, or an organic insulating layer including organic material.

A partition wall PW, first and second connection lines CNL1 and CNL2, first and second electrodes REL1 and REL2, and first and second contact electrodes CNE1 and CNE2 may be provided in the unit emission area 100 of the sub-pixel SP.

The partition wall PW may be provided on the substrate SUB and may define the unit emission area 100 of the sub-pixel SP. The partition wall PW may be provided in the form of enclosing an area in which the light emitting elements LD are aligned in the unit emission area 100 of the sub-pixel SP.

The partition wall PW may include an inorganic insulating layer formed of inorganic material or an organic insulating layer formed of organic material. In an embodiment, the partition wall PW may include a single organic insulating layer and/or a single inorganic insulating layer, but the disclosure is not limited thereto. For example, the partition wall PW may have a multi-layer structure formed by stacking organic insulating layers and inorganic insulating layers.

The partition wall PW may include first partition walls PW1 extending in a first direction DR1, and second partition walls PW2 extending in a second direction DR2 intersecting the first direction DR1. The partition wall PW may have a mesh shape by the first partition walls PW1 and the second partition walls PW2.

The partition wall PW having a mesh shape may have openings VO. Each of the openings VO may be an area formed by causing the first partition walls PW1 and the second partition walls PW2 to intersect each other.

One opening VO of the openings VO may be an area formed by causing two second partition walls PW2 adjacent to each other in the second direction DR2 to intersect two first partition walls PW1 adjacent to each other in the first direction DR1. Each of the openings VO may expose a portion of the substrate SUB that corresponds to an area in which the light emitting elements LD are aligned in the unit emission area 100.

In an embodiment of the disclosure, the first partition walls PW1 and the second partition walls PW2 may be brought into contact with each other and be connected to each other and may be integrally provided. The first partition walls PW1 and the second partition walls PW2 may respectively overlap the first electrode REL1 and the second electrode REL2, in a plan view.

Each of the first partition walls PW1 may partially overlap a corresponding electrode.

Although each of the second partition walls PW2 may completely overlap a corresponding electrode, the disclosure is not limited thereto. In some embodiments, each of the second partition walls PW2 may partially overlap the corresponding electrode. For example, one second partition wall PW2 of the second partition walls PW2 may completely overlap the first electrode REL1. A second partition wall PW2 that is adjacent to the one second partition wall PW2 may completely overlap the second electrode REL2.

The first partition walls PW1 and the second partition walls PW2 may be integrally provided, may be disposed on the same plane (or same layer) of the substrate SUB, and may have the same height.

As illustrated in FIG. 3A, each of the second partition walls PW2 may include a curved surface having a cross-sectional shape such as a semi-circle, or a semi-ellipse, the width of which reduces from one surface of the substrate SUB toward an upper end of the cross-sectional shape, but the disclosure is not limited thereto. In an embodiment, as illustrated in FIG. 3B, each of the second partition walls PW2 may have a trapezoidal cross-section, the width of which reduces in width from the one surface of the substrate SUB toward an upper end of the cross-sectional shape.

In a sectional diagram, the shape of each of the second partition walls PW2 is not limited to the foregoing examples and may vary within a range in which the efficiency of light emitted from each of the light emitting elements LD can be enhanced.

Although not illustrated in the drawings, the sectional shape of each of the first partition walls PW1 may be substantially identical to the sectional shape of each of the second partition walls PW2.

As described above, the partition wall PW having a mesh shape may be a closed-type structure which encloses the first and second electrodes REL1 and REL2 in the unit emission area 100 of the sub-pixel SP and allows only portions of the substrate SUB that correspond to the respective openings VO to be exposed. However, the disclosure is not limited to the foregoing example.

In an embodiment of the disclosure, the partition wall PW may have a rectangular shape including linear sides on the perimeter thereof, but the disclosure is not limited thereto. In an embodiment, the perimeter of the partition wall PW may be formed in various forms such as a circular shape or an elliptical shape having a curved side, or a semi-circular shape or a semi-elliptical shape including sides formed of a linear line and a curved line.

In an embodiment of the disclosure, the light emitting elements LD may be provided on the portions of the substrate SUB that are exposed through the respective openings VO between the first electrode REL1 and the second electrode REL2.

The first connection line CNL1 may extend in the first direction DR1 in the sub-pixel SP and may include a 1-1-th connection line CNL1_1 electrically connected with the first electrode REL1, and a 1-2-th connection line CNL1_2 provided on the 1-1-th connection line CNL1.

The 1-1-th connection line CNL1_1 may be integrally provided with the first electrode REL1. The 1-1-th connection line CNL1_1 may be provided only in the sub-pixel SP so that the sub-pixel SP may be electrically separated from sub-pixels adjacent thereto. Hence, the sub-pixel SP may be driven independently from the sub-pixels adjacent thereto.

The second connection line CNL2 may include a 2-1-th connection line CNL2_1 electrically connected with the second electrode REL2, and a 2-2-th connection line CNL2_2 provided on the 2-1-th connection line CNL2_1.

The 2-1-th connection line CNL2_1 may be integrally provided with the second electrode REL2, and may extend not only to the sub-pixel SP but also to the sub-pixels adjacent to the sub-pixel SP. Hence, the sub-pixel SP and the sub-pixels adjacent thereto may be electrically connected in common to the 2-1-th connection line CNL2_1.

The first electrode REL1 may include a 1-1-th electrode REL1_1 and a 1-2-th electrode REL1_2 which diverge in the second direction DR2 from the 1-1-th connection line CNL1_1 extending in the first direction DR1. The 1-1-th electrode REL1_1, the 1-2-th electrode REL1_2, and the 1-1-th connection line CNL1_1 may be integrally provided and electrically and/or physically connected to each other.

The second electrode REL2 may diverge in the second direction DR2 from the 2-1-th connection line CNL2_1 extending in the first direction DR1. The second electrode REL2 and the 2-1-th connection line CNL2_1 may be integrally provided and electrically and/or physically connected to each other.

The first and second electrodes REL1 and REL2 each may have a bar shape extending in the second direction DR2 in a plan view, but the disclosure is not limited thereto. In an embodiment, the shape of each of the first and second electrodes REL1 and REL2 may be changed in various ways within a range in which an electric field for aligning the light emitting elements LD in the sub-pixel SP can be formed.

In a plan view, the second electrode REL2 may be provided between the 1-1-th electrode REL1_1 and the 1-2-th electrode REL1_2 and spaced apart from each of the 1-1-th and 1-2-th electrodes REL1_1 and REL1_2 by a predetermined distance. The 1-1-th electrode REL1_1, the 1-2-th electrode REL12, and the second electrode REL2 may be alternately disposed on the substrate SUB.

Before the light emitting elements LD are aligned in the sub-pixel SP, a first alignment voltage may be applied to the first electrode REL through the 1-1-th connection line CNL1_1, and a second alignment voltage may be applied to the second electrode REL2 through the 2-1-th connection line CNL2_1. The first alignment voltage and the second alignment voltage may have different voltage levels.

As predetermined alignment voltages having different voltage levels are respectively applied to the first electrode REL1 and the second electrode REL2, an electric field may be formed between the first electrode REL1 and the second electrode REL2. The light emitting elements LD may be aligned on the substrate SUB between the first electrode REL1 and the second electrode REL2 by the electric field.

Each of the first electrode REL1 and the second electrode REL2 may be provided on the partition wall PW2. For example, the 1-1-th electrode REL1_1 may be provided on one second partition wall PW2 (hereinafter, referred to as "2-1-th partition wall") of the second partition walls PW2 of the partition wall PW. The second electrode REL2 may be provided on one second partition wall PW2 (hereinafter, referred to as "2-2-th partition wall") adjacent to the 2-1-th partition wall PW2. The 1-2-th electrode REL1_2 may be provided on one second partition wall PW2 (hereinafter, referred to as "2-3-th partition wall") adjacent to the 2-2-th partition wall PW2.

Hence, each of the first and second electrodes REL1 and REL2 may have a shape corresponding to the shape of the corresponding second partition wall PW2.

In the case where the second partition wall PW2 has a trapezoidal cross-section, each of the first and second electrodes REL1 and REL2 may have an inclined structure corresponding to an inclination of the sides of the corresponding second partition wall PW2. In the case where the second partition wall PW2 has a semi-circular or semi-elliptical cross-section, each of the first and second electrodes REL1 and REL2 may have a curvature corresponding to a curved surface of the corresponding second partition wall PW2.

In a plan view, each of the first and second electrodes REL1 and REL2 may overlap the corresponding second partition wall PW2. For example, the 1-1-th electrode REL1_1 may overlap the 2-1-th partition wall PW2. The second electrode REL2 may overlap the 2-2-th partition wall PW2. The 1-2-th electrode REL1_2 may overlap the 2-3-th partition wall PW2.

In a plan view, each of the first and second electrodes REL1 and REL2 may partially overlap the first partition walls PW1 of the partition wall PW. For example, the 1-1-th electrode REL1_1 may overlap a first side of each of the first partition walls PW1 (hereinafter, referred to as "1-1-th partition wall") disposed between the 1-1-th electrode REL1_1 and the second electrode REL2, among the first partition walls PW1. The second electrode REL2 may overlap a second side of each of the 1-1-th partition walls PW1 and overlap a first side of each of the first partition walls PW1 (hereinafter, referred to as "1-2-th partition wall") disposed between the second electrode REL2 and the 1-2-th electrode REL1_2, among the first partition walls PW1. The 1-2-th electrode REL1_2 may overlap a second side of each of the 1-2-th partition walls PW1.

The first and second electrodes REL1 and REL2 may be provided on the substrate SUB at positions spaced apart from each other with the light emitting elements LD interposed therebetween.

In an embodiment of the disclosure, the first electrode REL1 may be disposed adjacent to one of the opposite ends EP1 and EP2 of each of the light emitting elements LD and may be electrically connected to the light emitting elements LD through the first contact electrode CNE1. The second electrode REL2 may be disposed adjacent to the other one of the opposite ends EP1 and EP2 of each of the light emitting elements LD and may be electrically connected to the light emitting elements LD through the second contact electrode CNE2.

The first electrode REL1 and the second electrode REL2 may be disposed on the same plane and may have the same height. If the first electrode REL1 and the second electrode REL2 have the same height, each of the light emitting elements LD may be more reliably connected to the first and second electrodes REL1 and REL2.

The first and second electrodes REL1 and REL2, the 1-1-th connection line CNL1_1, and the 2-1-th connection line CNL2_1 may be formed of conductive material. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

Each of the first and second electrodes REL1 and REL2, the 1-1-th connection line CNL1_1, and the 2-1-th connection line CNL2_1 may have a single layer structure, but the disclosure is not limited thereto; for example, it may have a multilayer structure formed by stacking two or more materials of metals, alloys, conductive oxides, and conductive polymers.

The materials of the first and second electrodes REL1 and REL2, the 1-1-th connection line CNL1_1, and the 2-1-th connection line CNL2_1 are not limited to the foregoing materials. For example, the first and second electrodes REL1 and REL2, the 1-1-th connection line CNL1_1, and the 2-1-th connection line CNL2_1 may be made of conductive material having a predetermined reflectivity to allow light emitted from the opposite ends of the light emitting elements LD to travel in a direction (e.g., a frontal direction) in which an image is displayed.

Since the first and second electrodes REL1 and REL2 have shapes corresponding to the shapes of the first and second partition walls PW1 and PW2, light emitted from the opposite ends EP1 and EP2 of each of the light emitting elements LD may be reflected by the first and second electrodes REL1 and REL2, whereby the light may more effectively travel in the frontal direction. Consequently, the efficiency of light emitted from the light emitting elements LD may be enhanced.

In an embodiment of the disclosure, the first and second partition walls PW1 and PW2, along with the first and second electrodes REL1 and REL2 provided on the first and second partition walls PW1 and PW2, may function as reflective components for enhancing the efficiency of light emitted from each of the light emitting elements LD.

Although for the sake of explanation the first and second electrodes REL1 and REL2 are illustrated as being directly provided on the substrate SUB, the disclosure is not limited thereto. For example, a component for enabling the display device to be driven as a passive matrix or an active matrix may be further provided between the substrate SUB and the first and second electrodes REL1 and REL2.

In the case where the light emitting device is driven as the active matrix, for example, signal lines, an insulating layer, and/or a transistor may be provided between the substrate SUB and the first and second electrodes REL1 and REL2.

The signal lines may include a scan line, a data line, a power line, etc. The transistor may be electrically connected to the signal lines and may include a gate electrode, a semiconductor layer, a source electrode, and a drain electrode.

Any one of the first and second electrodes REL1 and REL2 may be an anode electrode, and the other may be a cathode electrode. In an embodiment of the disclosure, the first electrode REL1 may be an anode electrode, and the second electrode REL2 may be anode electrode.

In this case, one electrode of the source and drain electrodes of the transistor may be electrically connected to any one electrode of the first and second electrodes REL1 and REL2. A data signal of the data line may be applied to the any one electrode through the transistor. Here, the numbers and shapes of signal lines, insulating layer, and/or transistors may vary.

In an embodiment of the disclosure, the first electrode REL1 may be electrically connected to the transistor through a contact hole (not illustrated). Hence, a signal provided to the transistor may be applied to the first electrode REL1. In the case where the light emitting device is driven as an active matrix, the second electrode REL2 may be electrically connected to the signal line through the contact hole (not illustrated). Hence, a voltage of the signal line may be applied to the second electrode REL2.

In an embodiment of the disclosure, the light emitting elements LD may include first light emitting elements LD1 aligned between the 1-1-th electrode REL1_1 and the second electrode REL2, and second light emitting elements LD2 aligned between the second electrode REL2 and the 1-2-th electrode REL1_2.

A first end EP1 of each of the first light emitting elements LD1 may be electrically connected to the 1-1-th electrode REL1_1 through the first contact electrode CNE1. Hence, a signal of the transistor may be transmitted to the first end EP1 of each of the first light emitting elements LD1. A second end EP2 of each of the first light emitting elements LD1 may be electrically connected to the second electrode REL2 through the second contact electrode CNE2. Hence, a voltage of the signal line may be transmitted to the second end EP2 of each of the first light emitting elements LD1.

A first end EP1 of each of the second light emitting elements LD2 may be electrically connected to the second electrode REL2 through the second contact electrode CNE2. Hence, a voltage of the signal line may be transmitted to the first end EP1 of each of the second light emitting elements LD2. A second end EP2 of each of the second light emitting elements LD2 may be electrically connected to the 1-2-th electrode REL1_2 through the first contact electrode CNE1. Hence, a signal of the transistor may be transmitted to the second end EP2 of each of the second light emitting elements LD2.

The first and second light emitting elements LD1 and LD2 may form (or constitute) a light source of the sub-pixel SP. For example, if driving current flows through the sub-pixel SP during each frame period, the light emitting elements LD electrically connected to the first and second electrodes REL1 and REL2 of the sub-pixel SP may emit light having a luminance corresponding to the driving current.

The first contact electrode CNE1 may be provided on the first electrode REL1 to electrically and/or physically and reliably connect the first electrode REL1 with one end of the opposite ends EP1 and EP2 of each of the light emitting elements LD.

The first contact electrode CNE1 may be formed of transparent conductive material to allow light emitted from each of the light emitting elements LD and reflected by the first electrode REL1 to travel in the frontal direction without loss. For example, the transparent conductive material may include ITO, IZO, ITZO, etc. The material of the first contact electrode CNE1 is not limited to the above-mentioned materials.

In a plan view, the first contact electrode CNE1 may cover the first electrode REL1 and overlap the first electrode REL1. The first contact electrode CNE1 may partially overlap one of the opposite ends EP1 and EP2 of each of the light emitting elements LD.

In an embodiment of the disclosure, the first contact electrode CNE1 may include a 1-1-th contact electrode CNE1_1 provided on the 1-1-th electrode REL1_1, and a 1-2-th contact electrode CNE1_2 provided on the 1-2-th electrode REL1_2.

In a plan view, the 1-1-th contact electrode CNE1_1 may overlap the first end EP1 of each of the first light emitting elements LD1 and the 1-1-th electrode REL1_1. In a plan view, the 1-2-th contact electrode CNE1_2 may overlap the second end EP2 of each of the second light emitting elements LD2 and the 1-2-th electrode REL1_2.

A third insulating layer INS3 for covering the first contact electrode CNE1 may be provided on the first contact electrode CNE1. The third insulating layer INS3 may prevent the first contact electrode CNE1 from being exposed to the outside, thus preventing the first contact electrode CNE1 from corroding.

The third insulating layer INS3 may be formed of an inorganic insulating layer including inorganic material, or an organic insulating layer including organic material. Although the third insulating layer INS3 may have a single layer structure as shown in the drawing, the disclosure is not limited thereto. For example, the third insulating layer INS3 may have a multi-layer structure. In the case where the third insulating layer INS3 has a multi-layer structure, the third insulating layer INS3 may have a structure formed by alternately stacking inorganic insulating layers and organic insulating layers. For example, the third insulating layer INS3 may have a structure formed by sequentially stacking a first inorganic insulating layer, an organic insulating layer, and a second inorganic insulating layer.

The second contact electrode CNE2 may be provided on the second electrode REL2. In a plan view, the second contact electrode CNE2 may cover the second electrode REL2 and overlap the second electrode REL2. The second contact electrode CNE2 may overlap the second end EP2 of each of the first light emitting elements LD1 and the first end EP1 of each of the second light emitting elements LD2.

The second contact electrode CNE2 and the first contact electrode CNE1 may be made of the same material, but the disclosure is not limited thereto.

A fourth insulating layer INS4 for covering the second contact electrode CNE2 may be provided on the second contact electrode CNE2. The fourth insulating layer INS4 may prevent the second contact electrode CNE2 from being exposed to the outside, thus preventing the second contact electrode CNE2 from corroding. The fourth insulating layer INS4 may be formed of an inorganic insulating layer or an organic insulating layer.

An overcoat layer OC may be provided on the fourth insulating layer INS4.

The overcoat layer OC may be a planarization layer for mitigating height differences between top surfaces formed by the first and second partition walls PW1 and PW2, the first and second electrodes REL1 and REL2, the first and second contact electrodes CNE1 and CNE2, etc., which are disposed under the overcoat layer OC. The overcoat layer OC may be an encapsulation layer for preventing oxygen or water from penetrating into the light emitting elements LD.

In some embodiments, the overcoat layer OC may be omitted. In the case where the overcoat layer OC is omitted, the fourth insulating layer INS4 may function as an encapsulation layer for preventing oxygen or water from penetrating into the light emitting elements LD.

As described above, predetermined voltages may be respectively applied to the opposite ends EP1 and EP2 of each of the first light emitting elements LD1 through the 1-1-th electrode REL1_1 and the second electrode REL2. Hence, each of the first light emitting elements LD1 may emit light by coupling of electron-hole pairs in the active layer 12 of each of the first light emitting elements LD1.

Predetermined voltages may be respectively applied to the opposite ends EP1 and EP2 of each of the second light emitting elements LD2 through the second electrode REL2 and the 1-2-th electrode REL1_2. Hence, each of the second light emitting elements LD2 may emit light by coupling of electron-hole pairs in the active layer 12 of each of the second light emitting elements LD2.

A first capping layer CPL1 and a second capping layer CPL2 may be provided in the unit emission area 100 of the sub-pixel SP.

The first capping layer CPL1 may be provided on the first electrode REL1. The first capping layer CPL1 may prevent the first electrode REL1 from being damaged by defects or the like caused during a process of fabricating the light emitting device, and may further increase adhesive force between the first electrode REL1 and the substrate SUB.

The first capping layer CPL1 may be formed of transparent conductive material such as IZO to minimize loss of light emitted from each of the light emitting elements LD and reflected by the first electrode REL1 in the frontal direction.

In an embodiment of the disclosure, the first capping layer CPL1 may include a 1-1-th capping layer CPL1_1 and a 1-2-th capping layer CPL1_2. The 1-1-th capping layer CPL1_1 may be provided on the 1-1-th electrode REL1_1. The 1-2-th capping layer CPL1_2 may be provided on the 1-2-th electrode REL1_2.

The 1-1-th capping layer CPL1_1 and the 1-2-th capping layer CPL1_2 may be electrically connected to the 1-2-th connection line CNL1_2 extending in the first direction DR1. The 1-2-th connection line CNL1_2 may be integrally provided with the 1-1-th capping layer CPL1_1 and the 1-2-th capping layer CPL1_2.

The 1-2-th connection line CNL1_2 may be provided on the 1-1-th connection line CNL1_1 and may overlap the 1-1-th connection line CNL1_1 in a plan view. Hence, the first connection line CNL1 may be formed of a double-layer structure for low resistance.

The second capping layer CPL2 may be provided on the second electrode REL2. The second capping layer CPL2 may prevent the second electrode REL2 from being damaged by defects or the like caused during a process of fabricating the light emitting device, and may further increase adhesive force between the second electrode REL2 and the substrate SUB.

The second capping layer CPL2 and the first capping layer CPL1 may be provided on the same layer. The second capping layer CPL2 may include the same material as that of the first capping layer CPL1. The second capping layer CPL2 may be connected to the 2-2-th connection line CNL2_2 extending in the first direction DR1. The second capping layer CPL2 may be integrally provided with the 2-2-th connection line CNL2_2.

The 2-2-th connection line CNL2_2 may be provided on the 2-1-th connection line CNL2_1 and may overlap the 2-1-th connection line CNL2_1 in a plan view. Hence, the second connection line CNL2 may be formed of a double-layer structure for low resistance.

Hereinafter, the configuration of the display device according to an embodiment of the disclosure will be described in a stacking sequence with reference to FIGS. 2 and 3A.

The mesh-shaped partition wall PW including the first and second partition walls PW1 and PW2 may be provided on the substrate SUB on which the barrier layer BRL is provided. Due to the mesh shape of the partition wall PW, some areas of the substrate SUB that correspond to the respective openings VO formed by causing the first and second partition walls PW1 and PW2 to intersect each other may be exposed.

The 1-1-th connection line CNL1_1, the 2-1-th connection line CNL2_1, and the first and second electrodes REL1 and REL2 may be provided on the substrate SUB including the partition wall PW.

Each of the first electrode REL1 and the second electrode REL2 may be provided on the same plane on the corresponding second partition wall PW2.

The first capping layer CPL1 may be provided on the first electrode REL1. The second capping layer CPL2 may be provided on the second electrode REL2. The 1-2-th connection line CNL12 may be provided on the 1-1-th connection line CNL1_1. The 2-2-th connection line CNL2_2 may be provided on the 2-1-th connection line CNL2_1.

The first insulating layer INS1 may be provided on the substrate SUB including the first and second capping layers CPL1 and CPL2, etc. The first insulating layer INS' may be provided on the substrate SUB between the first electrode REL1 and the second electrode REL2. In an embodiment of the disclosure, the first insulating layer INS' may be provided on each of the some areas of the substrate SUB that are exposed through the respective openings VO of the partition wall PW between the first electrode REL1 and the second electrode REL2.

The light emitting elements LD may be aligned on the first insulating layer INS1. The light emitting elements LD may be induced to be self-aligned by an electric field formed between the first and second electrodes REL1 and REL2 and may be disposed on the first insulating layer INS1 between the first and second electrodes REL1 and REL2.

The second insulating layer INK may be provided on the light emitting elements LD to cover a portion of an upper surface of each of the light emitting elements LD and allow the opposite ends EP1 and EP2 of each of the light emitting elements LD to be exposed.

The first contact electrode CNE1 may be provided on the substrate SUB on which the second insulating layer INK, is provided. The first contact electrode CNE1 may cover the first capping layer CPL1 and may be electrically connected to the first electrode REL1 through the first capping layer CPL1. In an embodiment, in the case where the first capping layer CPL1 is omitted, the first contact electrode CNE1 may be directly provided on the first electrode REL1 and directly and electrically connected to the first electrode REL1.

The third insulating layer INS3 may be provided on the substrate SUB on which the first contact electrode CNE1 is provided.

The second contact electrode CNE2 may be provided on the substrate SUB on which the third insulating layer INS3 is provided. The second contact electrode CNE2 may cover the second capping layer CPL2 and be electrically connected to the second electrode REL2 through the second capping layer CPL2. In an embodiment, in the case where the second capping layer CPL2 is omitted, the second contact electrode CNE2 may be directly provided on the second electrode REL2 and directly and electrically connected to the second electrode REL2.

The fourth insulating layer INS4 may be provided on the substrate SUB on which the second contact electrode CNE2 is provided. The overcoat layer OC may be provided on the fourth insulating layer INS4.

As described above, in case that the electric field is formed between the first electrode REL1 and the second electrode REL2, the light emitting elements LD may be intensively disposed and aligned in each of the openings VO due to structural characteristics of the partition wall PW having a mesh shape. If sub-pixels adjacent to the sub-pixel SP also include the partition walls PW, light emitting elements LD may be intensively disposed and aligned in each of openings VO of the partition walls PW in the sub-pixels adjacent to the sub-pixel SP. In this case, alignment distribution of the light emitting elements LD in the sub-pixel SP and alignment distribution of the light emitting elements LD in each of the sub-pixels adjacent to the sub-pixel SP may be uniformized. In the case where the alignment distribution of the light emitting elements LD in each sub-pixel is uniformized, the efficiencies of light emitted from the light emitting elements LD of each sub-pixel may be substantially equal or similar to each other. Therefore, the light emitting device may have uniform light emitting distribution on the overall area thereof.

In an embodiment of the disclosure, the partition wall PW is designed to have a mesh shape, so that the light emitting elements LD may be intensively disposed and aligned in a target area of the sub-pixel SP, in other words, only in each of the openings VO of the partition wall PW. Hence, an abnormal alignment problem in which the light emitting elements LD are aligned in an undesired area may be prevented.

In an embodiment of the disclosure, since the light emitting elements LD are intensively disposed and aligned in each of the openings VO of the partition wall PW, a contact defect between each of the light emitting elements LD and electrodes electrically connected to the light emitting elements LD may be minimized. In an embodiment of the disclosure, the electrodes may include the first electrode REL1 and the second electrode REL2, but the disclosure is not limited thereto. In some embodiments, the electrodes may include the first contact electrode CNE1 and the second contact electrode CNE2.

FIGS. 4A to 4G are schematic plan diagrams sequentially illustrating a method of fabricating the light emitting device of FIG. 2. FIGS. 5A to 5I are schematic sectional diagrams sequentially illustrating a method of fabricating the light emitting device of FIG. 3A.

Referring to FIGS. 1A, 2, 3A, 4A, and 5A, a partition wall PW is formed on a substrate SUB of a unit emission area 100 of one sub-pixel SP.

In detail, after an insulating material layer (not illustrated) is applied onto the substrate SUB, a photoresist layer (not illustrated) is formed on the insulating material layer. A mask is disposed on the photoresist layer. Thereafter, the photoresist layer is patterned using the mask to form a photoresist pattern (not illustrated), some areas of which are selectively removed.

The partition wall PW having a mesh shape in a plan view is formed by selectively etching the insulating material layer using the photoresist pattern as a mask.

The partition wall PW may include first partition walls PW1 extending in a first direction DR1, and second partition walls PW2 extending in a second direction DR2 intersecting the first direction DR1. The partition wall PW may include openings VO which are areas formed by causing the first partition walls PW1 and the second partition walls PW2 to intersect each other.

One opening VO of the openings VO may be an area formed by causing two second partition walls PW2 adjacent to each other in the second direction DR2 intersect two first partition walls PW1 adjacent to each other in the first direction DR1. The one opening VO may have a first width W1 with respect to the first direction DR1, and a second width W2 with respect to the second direction DR2. Although the one opening VO may be provided in the form of a square, the first width W1 and the second width W2 of which are substantially equal to each other, the disclosure is not limited thereto. In an embodiment of the disclosure, the first width W1 of the one opening VO may be greater than a length L of one light emitting element LD illustrated in FIG. 1A.

In an embodiment of the disclosure, a distance W3 between the one opening VO and another opening VO adjacent to the one opening VO in the second direction DR2 may be equal to a width of each of the first partition walls PW1. A distance W4 between the one opening VO and another opening VO adjacent to the one opening VO in the first direction DR1 may be equal to a width of each of the second partition walls PW2.

In an embodiment of the disclosure, a distance d between one second partition wall PW2 of the second partition walls PW2 and another second partition wall PW2 adjacent to the one second partition wall PW2 in the first direction DR1 may be equal to or greater than the length L of each of the light emitting elements LD. The distance d between the one second partition wall PW2 and the another second partition wall PW2 may be substantially equal to the first width W1 of the one opening VO.

The first partition wall PW1 and the second partition wall PW2 may be integrally provided and may be connected to each other.

Each of the second partition walls PW2 may include a curved surface having a cross-sectional shape such as a semi-circle, or a semi-ellipse, the width of which reduces from one surface of the substrate SUB toward an upper end thereof. A height h of each of the second partition walls PW2 may range from about 1.2 μm to about 1.9 μm, but the disclosure is not limited thereto.

Referring to FIGS. 1A, 2, 3A, 4B, 5A, and 5B, after a first conductive layer (not illustrated) is formed on the substrate SUB including the partition wall PW, 1-1-th and 2-1-th connection lines CNL1_1 and CNL21 and first and second electrodes REL1 and REL2 are formed by patterning the first conductive layer using a mask.

Each of the 1-1-th connection lines CNL1_1 and the 2-1-th connection lines CNL2_1 may extend in the first direction DR1.

In an embodiment of the disclosure, not only the one sub-pixel SP but also sub-pixels (not illustrated) adjacent to the one sub-pixel SP in the first direction DR1 may be electrically connected in common to the 1-1-th connection line CNL1_1. Likewise, the one sub-pixel SP and the sub-pixels adjacent thereto may also be electrically connected in common to the 2-1-th connection line CNL21.

The first electrode REL1 may extend from the 1-1-th connection line CNL1_1 in the second direction DR2. The second electrode REL2 may extend from the 2-1-th connection line CNL21 in the second direction DR2. The 1-1-th connection line CNL11 and the first electrode REL1 may be integrally provided. The 2-1-th connection line CNL2_1 and the second electrode REL2 may be integrally provided.

The first electrode REL1 may include a 1-1-th electrode REL1_1 and a 1-2-th electrode REL1_2 which diverge from the 1-1-th connection line CNL1_1 with the second electrode REL2 interposed therebetween. The 1-1-th electrode REL1_1, the 1-2-th electrode REL1_2, and the second electrode REL2 may be disposed on the same plane at positions spaced apart from each other by a predetermined distance.

In a plan view, the 1-1-th electrode REL1_1 may overlap a corresponding second partition PW2 (hereinafter, referred to as "2-1-th partition wall") of the second partition walls PW2 of the partition wall PW. The second electrode REL2 may overlap one second partition wall PW2 (hereinafter, referred to as "2-2-th partition wall") adjacent to the 2-1-th partition wall PW2. The 1-2-th electrode REL1_2 may overlap one second partition wall PW2 (hereinafter, referred to as "2-3-th partition wall") adjacent to the 2-2-th partition wall PW2.

In a plan view, the openings VO of the partition wall PW may be disposed between the first electrode REL1 and the second electrode REL2. In a plan view, the first partition walls PW1 of the partition wall PW may be disposed between the first electrode REL1 and the second electrode REL2.

Referring to FIGS. 1A, 2, 3A, 4C, and 5A to 5C, first and second capping layers CPL1 and CPL2 and 1-2-th and 2-2-th connection lines CNL1_2 and CNL2_2 are formed on the substrate SUB on which the first and second electrodes REL1 and REL2, etc., are provided.

The first and second capping layers CPL1 and CPL2 and the 1-2-th and 2-2-th connection lines CNL1_2 and CNL2_2 may be provided on the same plane and may include the same material. For example, the first and second capping layers CPL1 and CPL2 and the 1-2-th and 2-2-th connection lines CNL1_2 and CNL2_2 may include transparent conductive material.

The first capping layer CPL1 may include a 1-1-th capping layer CPL1_1 and a 1-2-th capping layer CPL1_2 which diverge from the 1-2-th connection line CNL12 in the second direction DR2. The second capping layer CPL2 may diverge from the 2-2-th connection line CNL2_2 in the second direction and may be disposed between the 1-1-th capping layer CPL1_1 and the 1-2-th capping layer CPL1_2.

In a plan view, the 1-1-th capping layer CPL1_1 may overlap the 1-1-th electrode REL1_1; the 1-2-th capping layer CPL1_2 may overlap the 1-2-th electrode REL1_2; and the second capping layer CPL2 may overlap the second electrode REL2.

The 1-2-th connection line CNL1_2 may be integrally provided with the first capping layer CPL1 and thus electrically and/or physically connected to the first capping layer CPL1. The 2-2-th connection line CNL2_2 may be integrally provided with the second capping layer CPL2 and thus electrically and/or physically connected to the second capping layer CPL2.

The 1-2-th connection line CNL12 may extend in the first direction DR1, be formed on the 1-1-th connection line CNL1_1 and may overlap the 1-1-th connection line CNL1_1.

The 2-2-th connection line CNL2_2 may extend in the first direction DR1, be formed on the 2-1-th connection line CNL2_1 and may overlap the 2-1-th connection line CNL2_1. In an embodiment of the disclosure, the 2-1-th connection line CNL2_1 and the 2-2-th connection line CNL2_2 that are sequentially stacked may form a second connection line CNL2 having a double-layer structure.

Referring to FIGS. 1A, 2, 3A, 4D, and 5A to 5D, a first insulating material layer INSM1 is formed on the substrate SUB on which the first and second capping layers CPL1 and CPL2, etc. are provided. The first insulating material layer INSM1 may be formed of an inorganic insulating layer including inorganic material, or an organic insulating layer including organic material.

Thereafter, an electric field is formed between the first electrode REL1 and the second electrode REL2 by respectively applying corresponding alignment voltages to the first and second electrodes REL1 and REL2 through the 1-1-th and 2-1-th connection lines CNL1_1 and CNL2_1. In the case where alternating current power or direct current power having a predetermined voltage and period is repeatedly applied several times to each of the first and second electrodes REL1 and REL2 through the 1-1-th and 2-1-th connection lines CNL1_1 and CNL2_1, an electric field may be formed between the first and second electrodes REL1 and REL2 by a difference in potential between the first and second electrodes REL1 and REL2.

While the electric field is formed between the first electrode REL1 and the second electrode REL2, light emitting elements LD are supplied onto the substrate SUB by an inkjet printing method or the like. For example, the light emitting elements LD may be supplied onto the substrate SUB of the unit emission area 100 by disposing a nozzle over the substrate SUB and dropping a solvent including the light emitting elements LD onto the substrate SUB through the nozzle. The solvent may be any one of acetone, water, alcohol, and toluene, but the disclosure is not limited thereto. For example, the solvent may include material which may be vaporized at the room temperature or by heat. The solvent may have the form of ink or paste.

The method of supplying the light emitting elements LD onto the substrate SUB is not limited to the foregoing method. The method of supplying the light emitting elements LD may vary. Subsequently, the solvent may be removed.

If the light emitting elements LD are supplied onto the substrate SUB, self-alignment of the light emitting elements LD may be induced by the electric field formed between the first electrode REL1 and the second electrode REL2. Hence, the light emitting elements LD may be aligned between the first electrode REL1 and the second electrode REL2.

The light emitting elements LD may include first light emitting elements LD1 aligned between the 1-1-th electrode REL1_1 and the second electrode REL2, and second light emitting elements LD2 aligned between the second electrode REL2 and the 1-2-th electrode REL1_2.

In an embodiment of the disclosure, the light emitting elements LD may be aligned on the first insulating material layer INSM1 at positions corresponding to the respective openings VO between the first electrode REL1 and the second electrode REL2.

The first light emitting elements LD1 may be aligned on the first insulating material layer INSM1 in each of the openings VO between the 1-1-th electrode REL1_1 and the second electrode REL2. The second light emitting elements LD2 may be aligned on the first insulating material layer INSM1 in each of the openings VO between the second electrode REL2 and the 1-2-th electrode REL1_2.

Figure 4B:
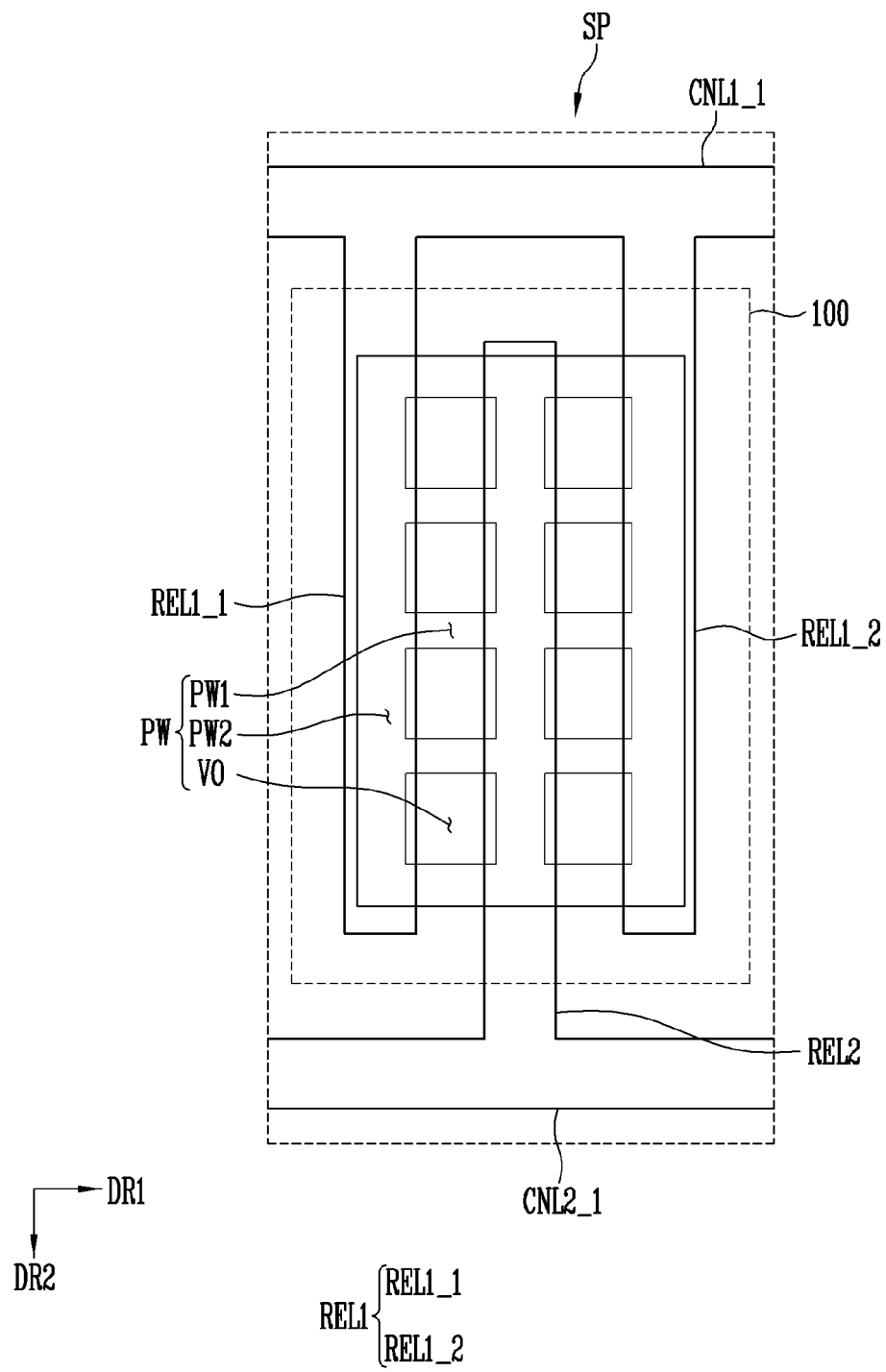
Figure 4C:
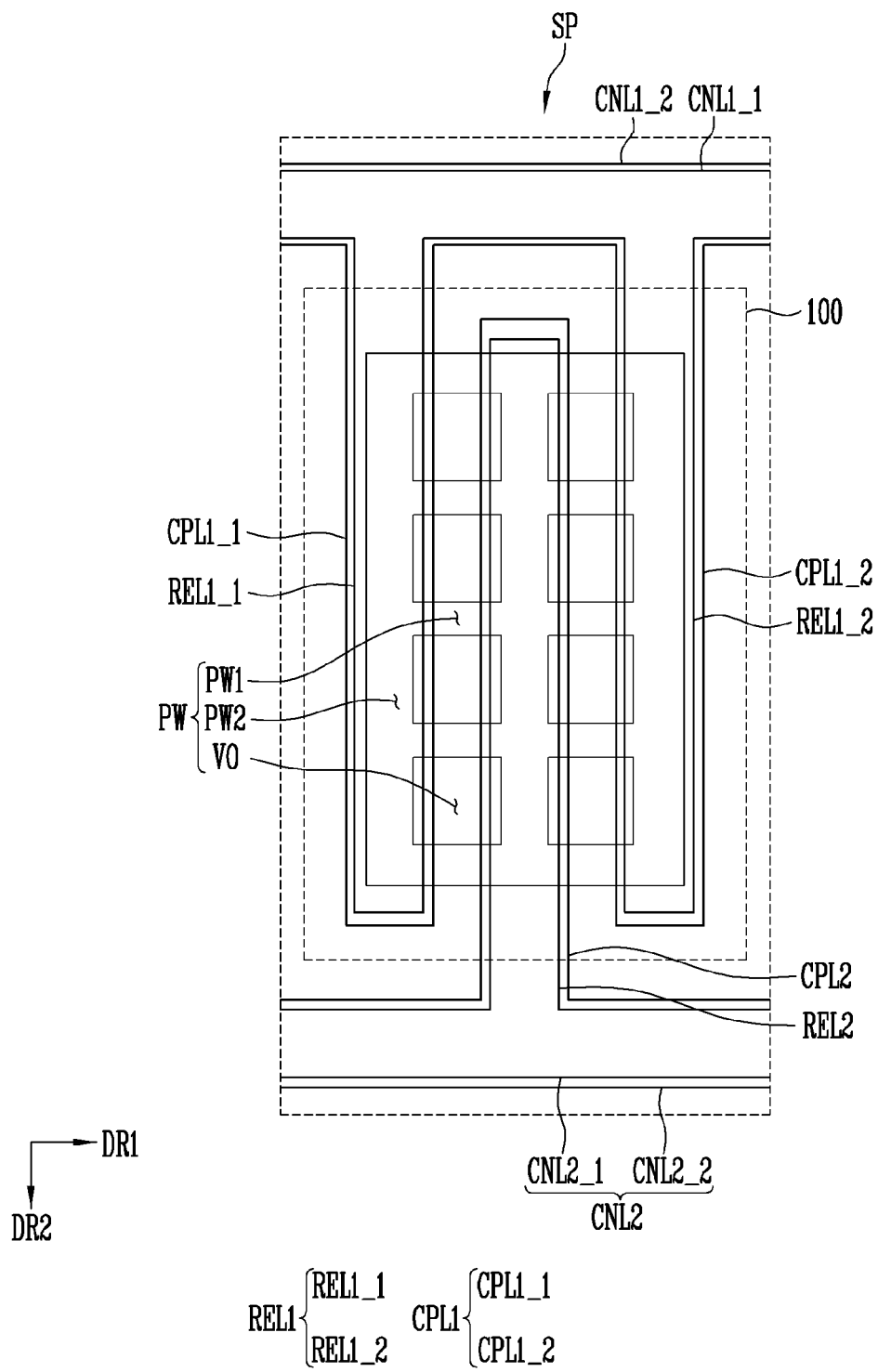
Figure 4D:
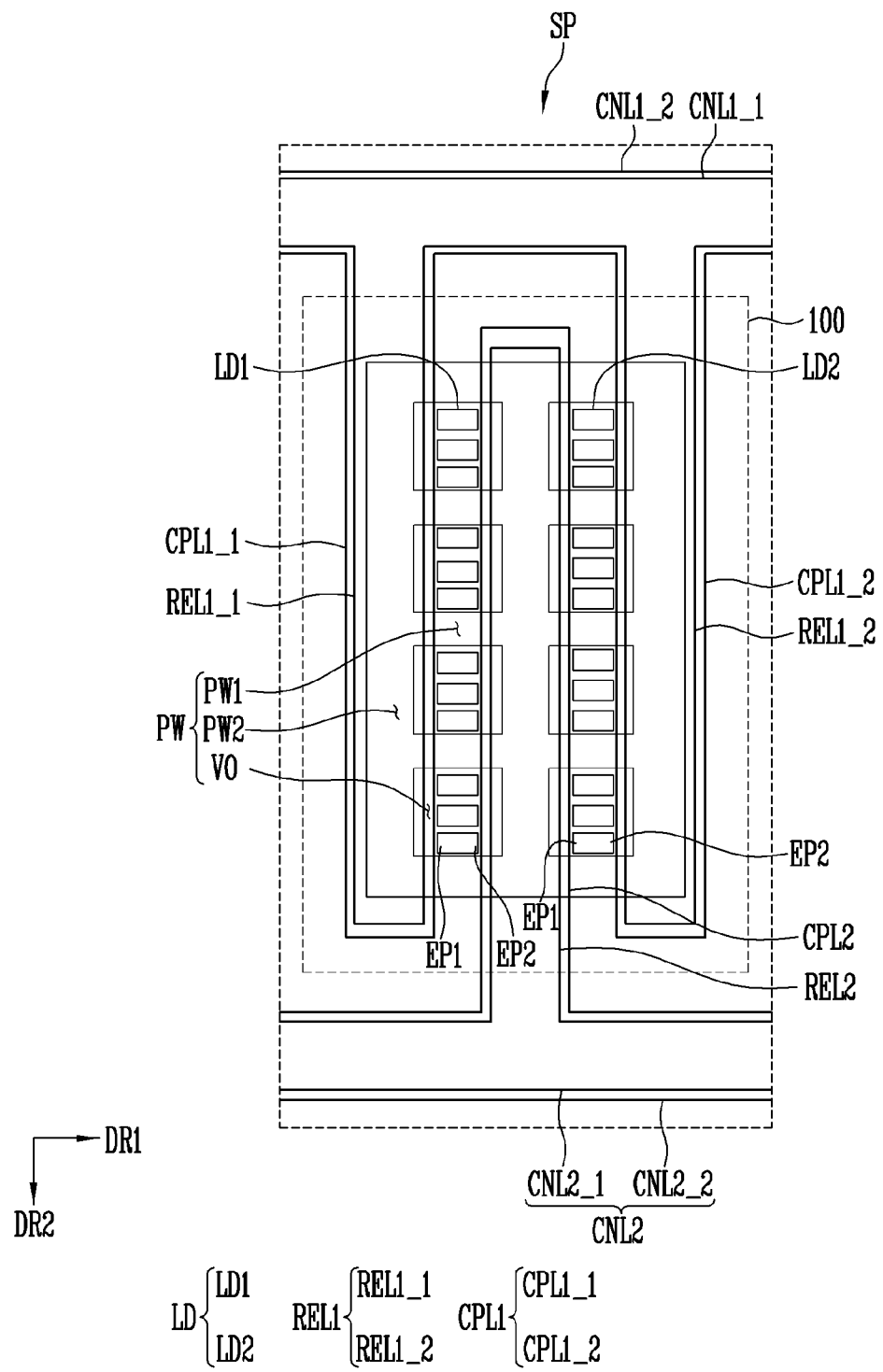
Figure 4E:
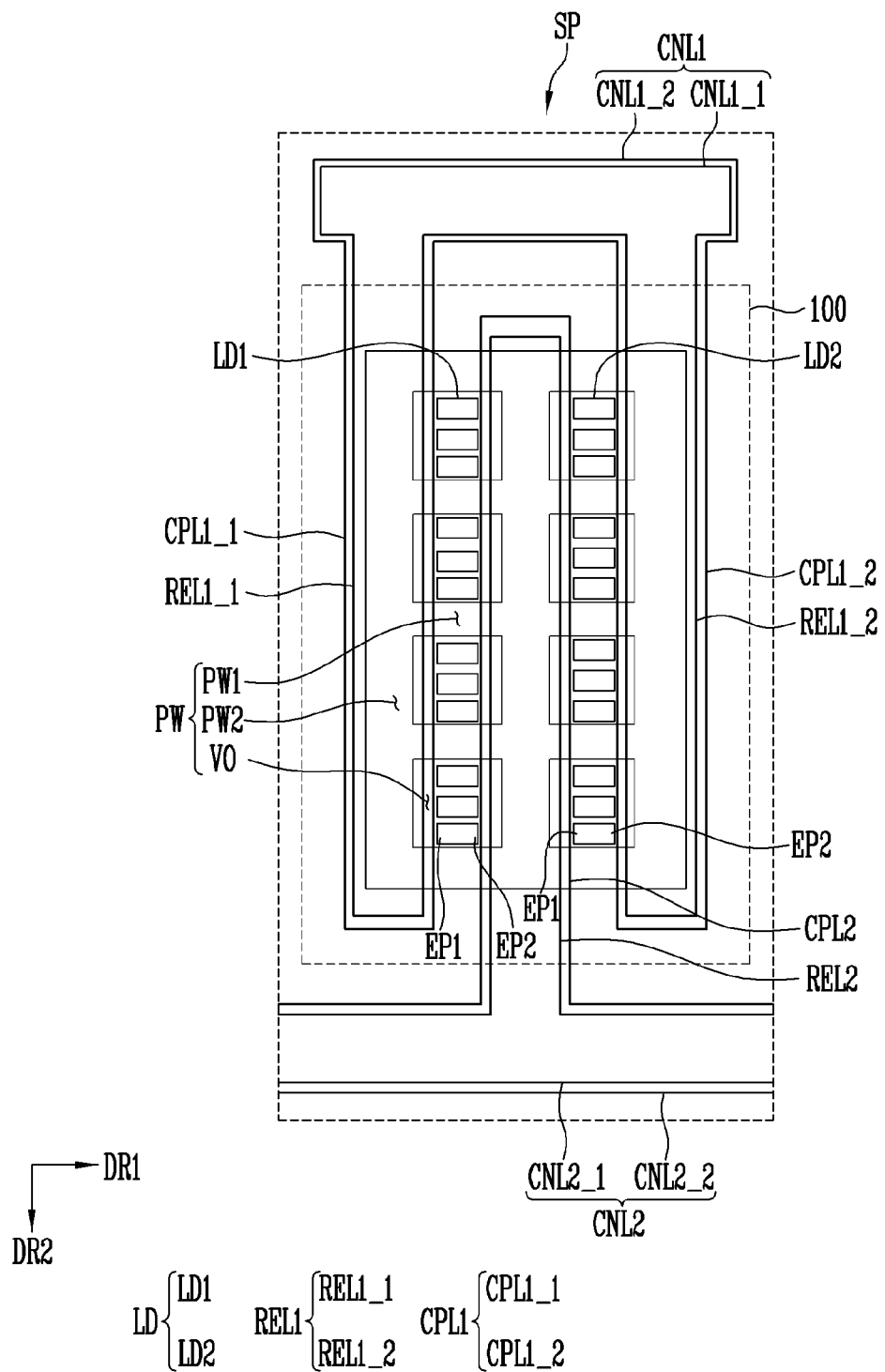
Figure 4F:
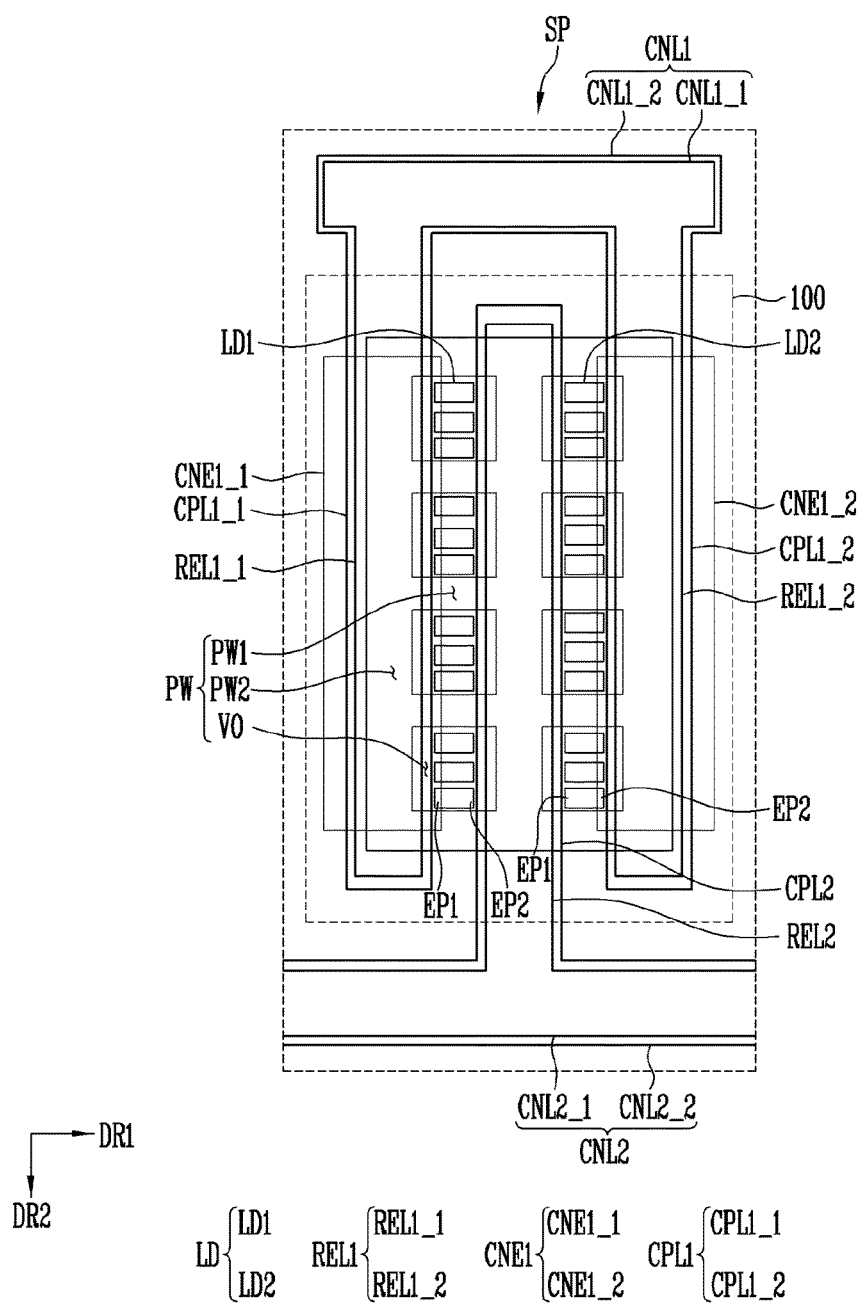
Figure 4G:
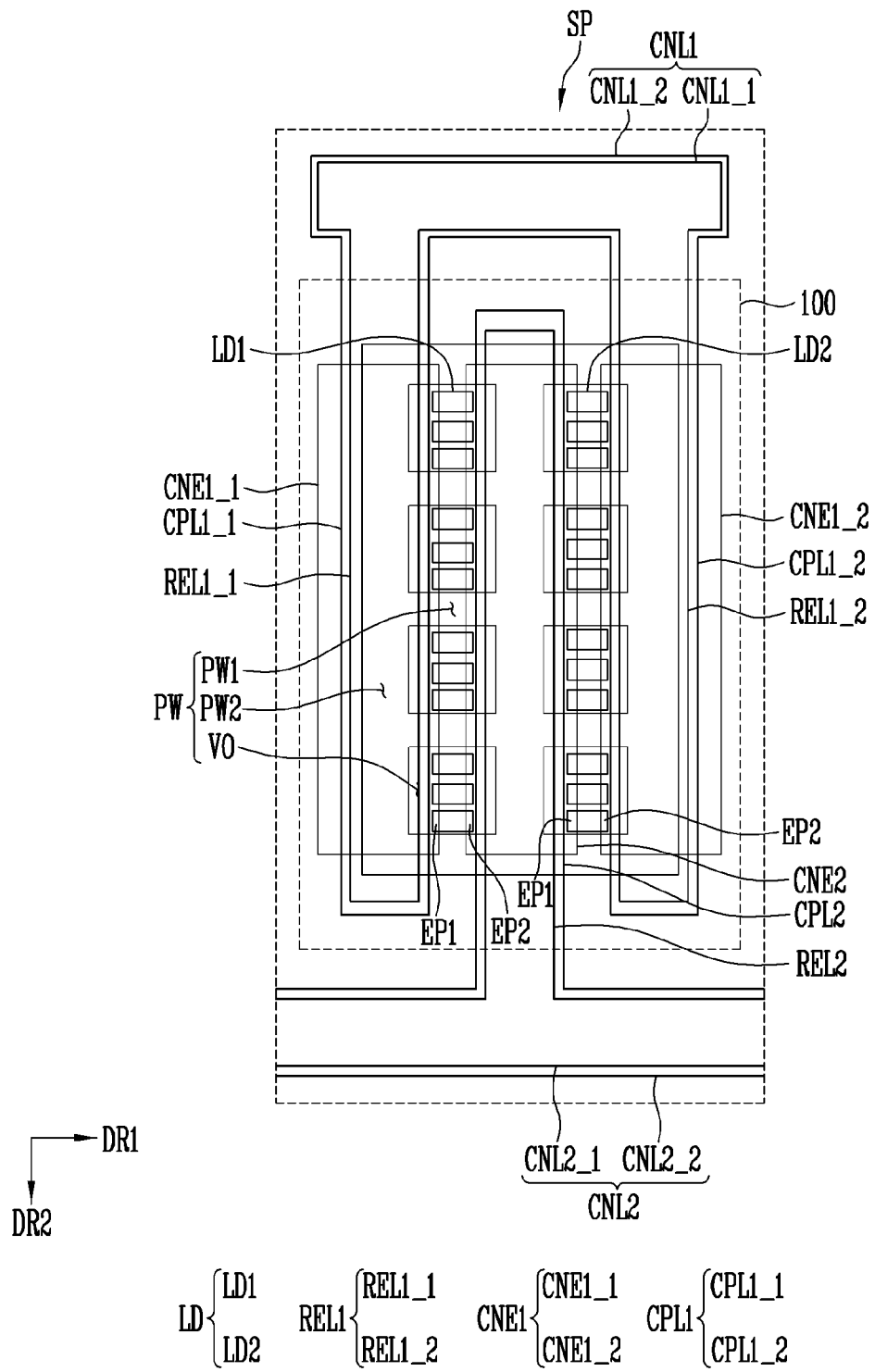
Figure 5A:
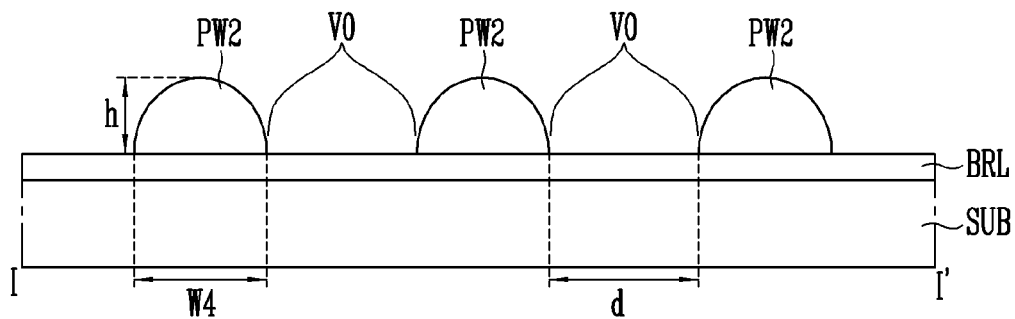
FIGS. 5A to 5I are schematic sectional diagrams sequentially illustrating a method of fabricating the light emitting device of FIG. 3A.
Figure 5B:
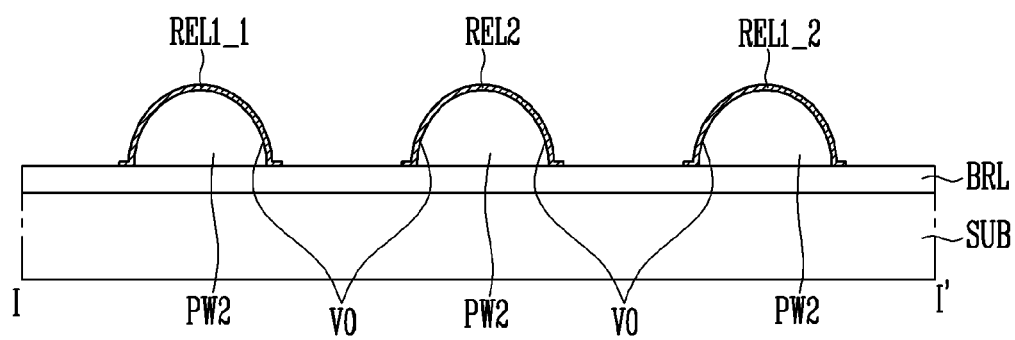
Figure 5C:
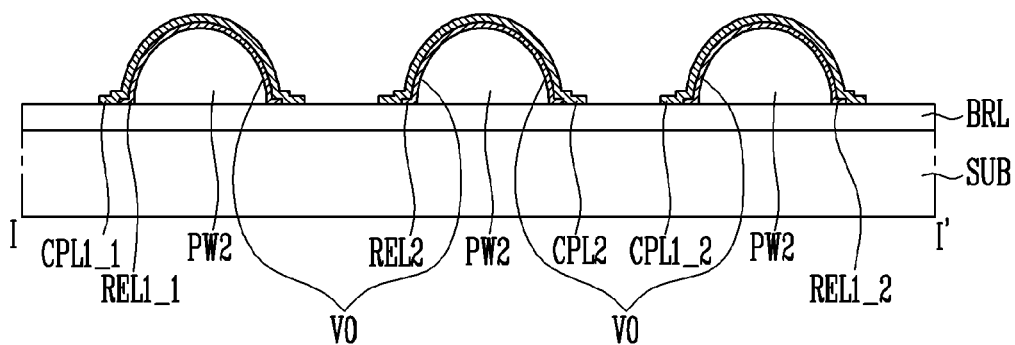
Figure 5D:
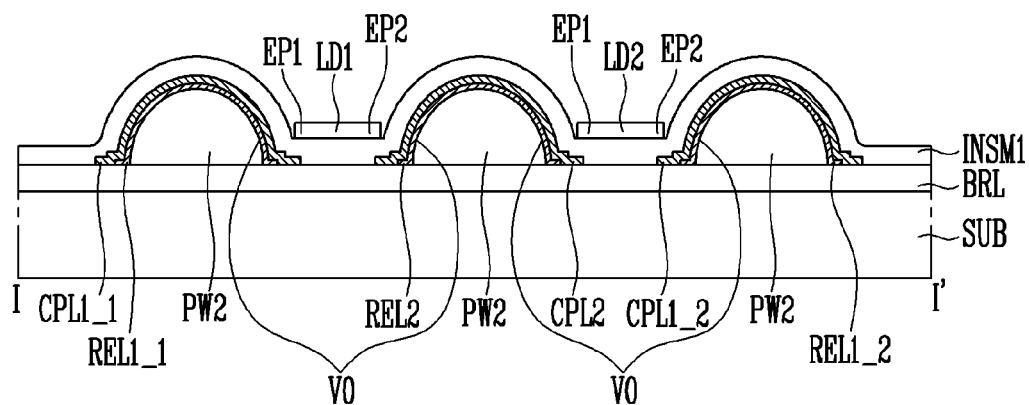
Figure 5E:
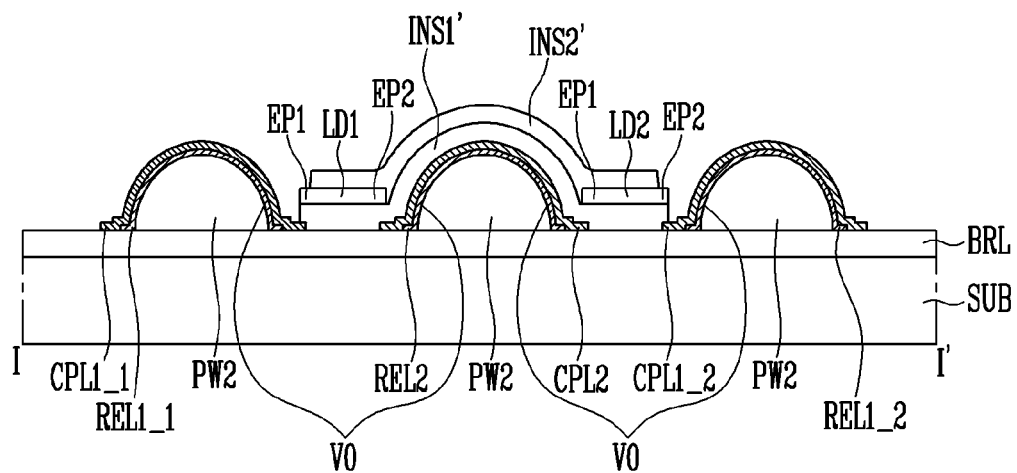
Figure 5F:
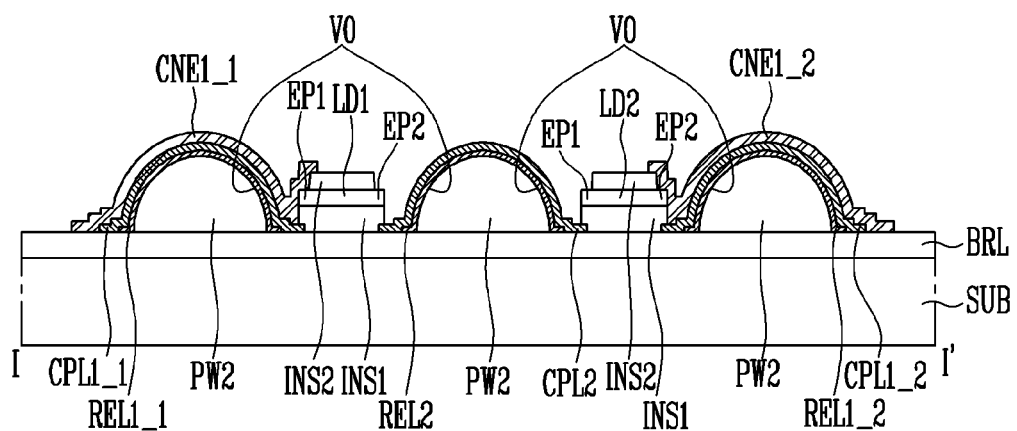
Figure 5G:
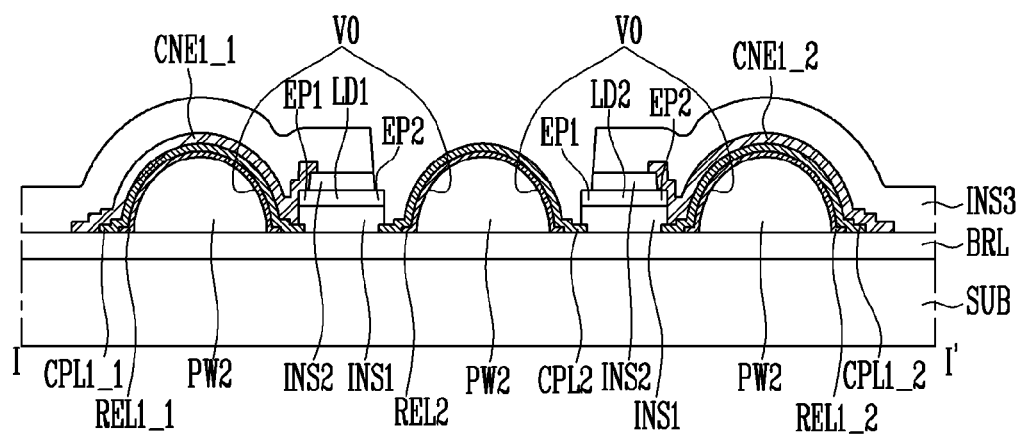
Figure 5H:
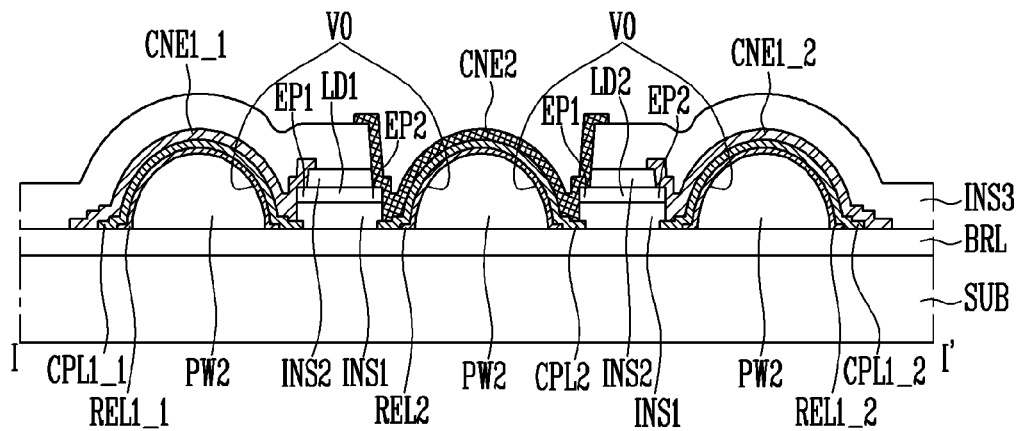
Figure 5I:
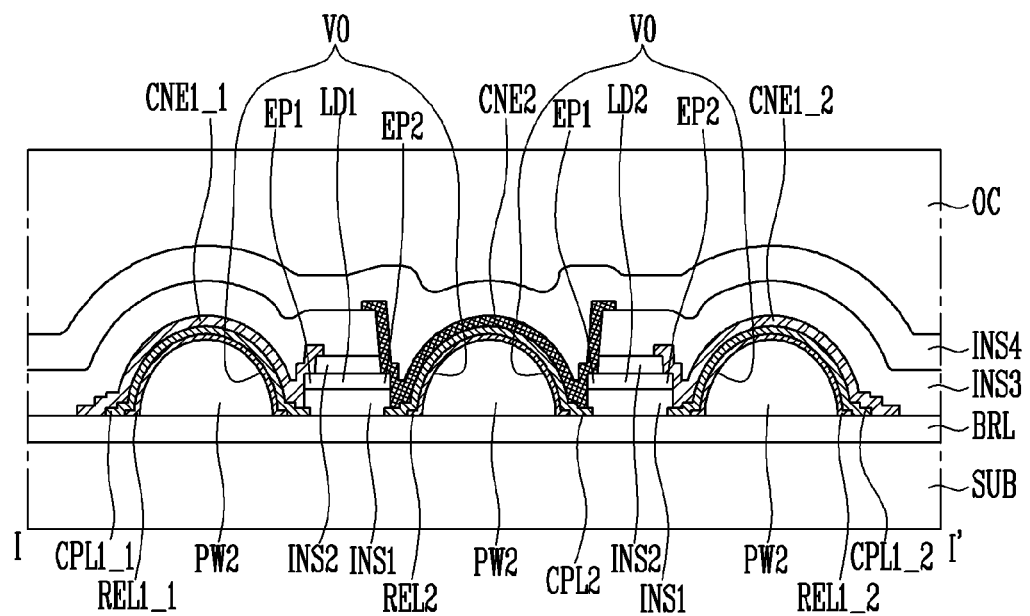

After the alignment of the light emitting elements LD has been completed, as illustrated in FIG. 4E, the 1-1-th and 1-2-th connection lines CNL1_1 and CNL1_2 are divided into parts between the one sub-pixel SP and the sub-pixels adjacent to the one sub-pixel SP so that the one sub-pixel SP can be independently driven.

As a result, a first connection line CNL1 having a double-layer structure in which the 1-1-th connection line CNL1_1 and the 1-2-th connection line CNL1_2 are sequentially stacked may be finally formed.

A second insulating material layer (not illustrated) is formed on the substrate SUB on which the first connection line CNL1 is provided.

Referring to FIGS. 1A, 2, 3A, and 5A to 5E, a second insulating pattern INS2' may be formed by patterning the second insulating material layer using a mask such that the second insulating pattern INK' allows the first capping layer CPL1, the respective first ends EP1 of the first light emitting elements LD1, and the respective second ends EP2 of the second light emitting elements LD2 to be exposed.

A first insulating pattern INS1' may be formed by also patterning the first insulating material layer INSM1 through the foregoing mask process. The first insulating pattern INS1' may allow the first capping layer CPL1 to be exposed.

Referring to FIGS. 1A, 2, 3A, 4F, and 5A to 5F, a first contact electrode CNE1 including a 1-1-th contact electrode CNE1_1 and a 1-2-th contact electrode CNE1_2 is formed on the substrate SUB including the second insulating pattern INS2'.

The 1-1-th contact electrode CNE1_1 may be provided on the 1-1-th capping layer CPL1_1 and may cover the 1-1-th electrode REL1_1 and the first end EP1 of each of the first light emitting elements LD1. The 1-2-th contact electrode CNE1_2 may be provided on the 1-2-th capping layer CPL1_2 and cover the 1-2-th electrode REL1_2 and the second end EP2 of each of the second light emitting elements LD2.

Referring to FIGS. 1A, 2, 3A, and 5A to 5G, a third insulating material layer (not illustrated) is applied onto the substrate SUB on which the first contact electrode CNE1 has been provided. Thereafter, a third insulating layer INS3 is formed by patterning the third insulating material layer using a mask such that the third insulating layer INS3 covers the first contact electrode CNE1 and allows the second capping layer CPL2, the second end EP2 of each of the first light emitting elements LD1, and the first end EP1 of each of the second light emitting elements LD2 to be exposed.

In an embodiment, in the case where the second capping layer CPL2 is omitted, the third insulating layer INS3 may allow the second electrode REL2 to be exposed.

The second insulating pattern INK' may be patterned together through the foregoing process using the mask to form a second insulating layer INK allowing the second capping layer CPL2, the second end EP2 of each of the first light emitting elements LD1, and the first end EP1 of each of the second light emitting elements LD2 to be exposed. In other words, the second insulating layer INS2 may be provided on only a portion of the upper surface of each of the first light emitting elements LD1 and only a portion of the upper surface of each of the second light emitting elements LD2.

The first insulating pattern INS1' may be patterned together through the foregoing process using the mask to form a first insulating layer INS1 allowing the second capping layer CPL2 to be exposed. In other words, the first insulating layer INS1 may be provided only between the substrate SUB and each of the first and second light emitting elements LD1 and LD2. The first insulating layer INS1 may be disposed under each of the first and second light emitting elements LD1 and LD2 to support each of the first and second light emitting elements LD1 and LD2 and may prevent each of the first and second light emitting elements LD1 and LD2 from being removed from the substrate SUB.

Referring to FIGS. 1A, 2, 3A, 4G, and 5A to 5H, a second contact electrode CNE2 is formed on the substrate SUB including the third insulating layer INS3. The second contact electrode CNE2 may be provided on the second capping layer CPL2 and may cover the second electrode REL2, the second end EP2 of each of the first light emitting elements LD1, and the first end EP1 of each of the second light emitting elements LD2.

Referring to FIGS. 1A, 2, 3A, and 5A to 5I, a fourth insulating layer INS4 is formed on the overall surface of the substrate SUB including the second contact electrode CNE2. Subsequently, an overcoat layer OC is formed on the fourth insulating layer INS4.

Figure 6:
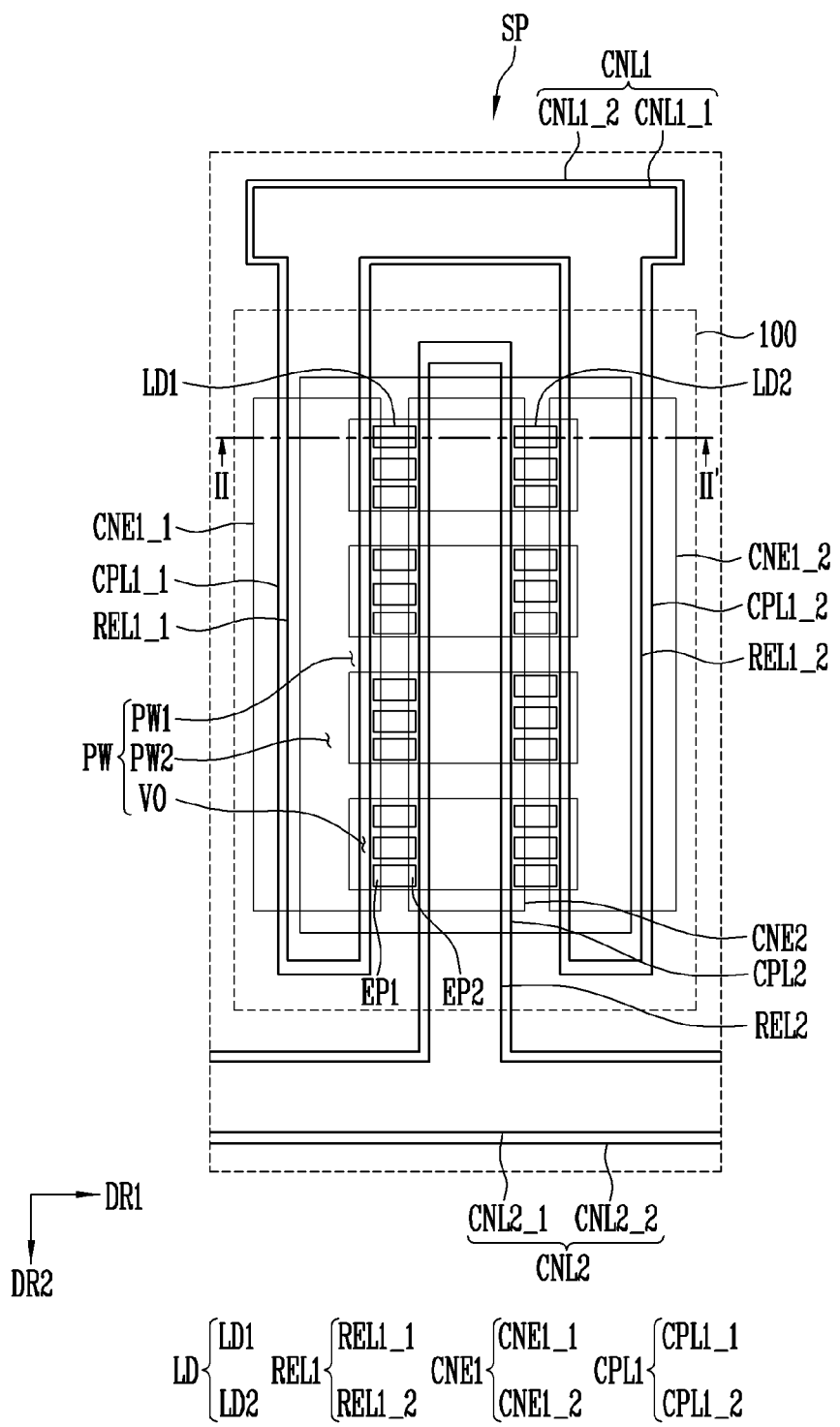
FIG. 6 is a schematic plan diagram illustrating an emission area of the light emitting device of FIG. 2 in accordance with an embodiment of the disclosure.
Figure 7:
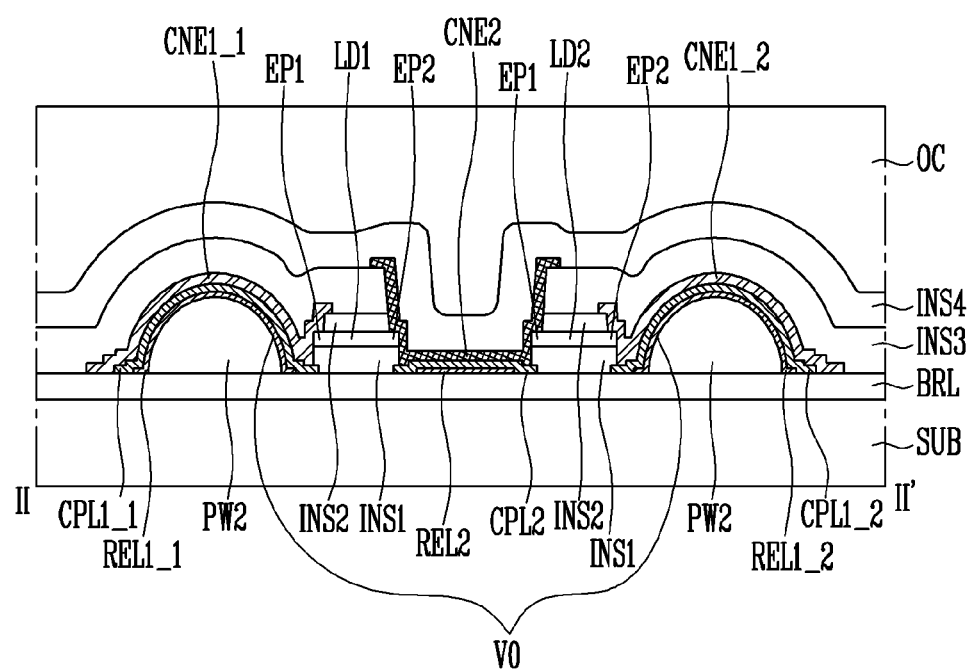
FIG. 7 is a schematic sectional diagram taken along line II-IF of FIG. 6.

FIG. 6 is a schematic plan diagram illustrating a unit emission area of the light emitting device of FIG. 2 in accordance with an embodiment of the disclosure, and FIG. 7 is a schematic sectional diagram taken along line II-IF of FIG. 6. In an embodiment of the disclosure, the following description will be focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

The configuration of the light emitting device illustrated in FIG. 6, other than the fact that a first electrode and a second electrode are disposed on different planes (or layers), may have substantially the same or similar to that of the light emitting device of FIG. 2.

Although for the sake of convenience, FIG. 6 illustrates that light emitting elements are aligned in a horizontal direction, the alignment of the light emitting elements is not limited thereto. In some embodiments, the light emitting elements may be aligned in a direction intersecting the horizontal direction.

In FIG. 6, the unit emission area may be a pixel area of one of the sub-pixels included in an emission display panel.

Referring to FIGS. 1A, 6, and 7, the light emitting device in accordance with an embodiment of the disclosure may include a substrate SUB including at least one sub-pixel SP having a unit emission area 100, and light emitting elements LD provided on the substrate SUB.

A partition wall PW, light emitting elements LD, first and second connection lines CNL1 and CNL2, first and second electrodes REL1 and REL2, and first and second contact electrodes CNE1 and CNE2 may be provided in the unit emission area 100 of the sub-pixel SP.

The first electrode REL1 may include a 1-1-th electrode REL1_1 and a 1-2-th electrode REL1_2 which diverge from a 1-1-th connection line CNL1_1 of the first connection line CNL1 in a second direction DR2. The second electrode REL2 may diverge from a 2-1-th connection line CNL2_1 of the second connection line CNL2 in the second direction DR2.

In a plan view, the second electrode REL2 may be provided between the 1-1-th electrode REL1_1 and the 1-2-th electrode REL1_2 and may be spaced apart from each of the 1-1-th and 1-2-th electrodes REL1_1 and REL1_2 by a predetermined distance.

The partition wall PW may be provided on the substrate SUB and define the unit emission area 100 of the sub-pixel SP. The partition wall PW may be provided to enclose the unit emission area 100 of the sub-pixel SP.

The partition wall PW may include an inorganic insulating layer formed of inorganic material or an organic insulating layer formed of organic material.

The partition wall PW may include first partition walls PW1 extending in a first direction DR1, and second partition walls PW2 extending in a second direction DR2 intersecting the first direction DR1. The partition wall PW may have a mesh shape by the first partition walls PW1 and the second partition walls PW2.

The partition wall PW having a mesh shape may have openings VO. Each of the openings VO may be an area formed by causing the first partition walls PW1 and the second partition walls PW2 to intersect each other. One opening VO of the openings VO may be an area formed by causing two second partition walls PW2 adjacent to each other in the second direction DR2 to intersect two first partition walls PW1 adjacent to each other in the first direction DR1. Each of the openings VO may expose a portion of the substrate SUB that corresponds to an area in which the light emitting elements LD are aligned in the unit emission area 100.

The first partition walls PW1 and the second partition walls PW2 may be integrally provided, may be disposed on the same plane of the substrate SUB, and may have the same height.

Each of the second partition walls PW2 may include a curved surface having a cross-sectional shape such as a semi-circle, or a semi-ellipse, the width of which reduces from one surface of the substrate SUB toward an upper end thereof, but the disclosure is not limited thereto. Each of the second partition walls PW2 may have various cross-sectional shapes.

Each of the first partition walls PW1 may overlap the first electrode REL1 and the second electrode REL2, in a plan view.

Each of the second partition walls PW2 may overlap only the first electrode REL1, in a plan view. In other words, in an embodiment of the disclosure, only the first electrode REL1 may be provided on only the corresponding second partition walls PW2. For example, the 1-1-th electrode REL1_1 may be provided on one second partition wall PW2 (hereinafter, referred to as "2-1-th partition wall") of the second partition walls PW2. The 1-2-th electrode REL1_2 may be provided on one second partition wall PW2 (hereinafter, referred to as "2-2-th partition wall") adjacent to the 2-1-th partition wall PW2.

The second electrode REL2 may be provided on the substrate SUB in the openings VO of the partition wall PW provided between the 2-1-th partition wall PW2 and the 2-2-th partition wall PW2.

The first electrode REL1 may be provided on the corresponding second partition wall PW2. The second electrode REL2 may be provided on the substrate SUB in each of the openings VO of the partition wall PW. Therefore, the first electrode REL1 and the second electrode REL2 may be provided on different layers, i.e., on different planes rather than on the same plane.

In an embodiment of the disclosure, the first electrode REL1 may be provided on the corresponding second partition wall PW2. The first electrode REL1 and the corresponding second partition wall PW2 may have substantially the same shape. Hence, the first electrode REL1 may have a protrusion which protrudes upward from one surface of the substrate SUB by the height of the corresponding second partition wall PW2. The second electrode REL2 may be provided on the substrate SUB in the openings VO provided between the 2-1-th partition wall PW2 and the 2-2-th partition wall PW2. Hence, the second electrode REL2 may have a height different from that of the first electrode REL1.

The light emitting elements LD may be aligned between the first electrode REL1 and the second electrode REL2 at positions corresponding to the insides of the openings VO. In a plan view, the light emitting elements LD may be provided on the substrate SUB at a position corresponding to the inside of each of the opening VO.

The light emitting elements LD may include first light emitting elements LD1 aligned between the 1-1-th electrode REL1_1 and the second electrode REL2, and second light emitting elements LD2 aligned between the second electrode REL2 and the 1-2-th electrode REL1_2.

One first light emitting element LD1 (hereinafter, referred to as "1-1-th light emitting element") of the first light emitting elements LD1 and one second light emitting element LD2 (hereinafter, referred to as "2-1-th light emitting element") adjacent to the 1-1-th light emitting element LD1 in the first direction DR1 may be provided on the substrate SUB at positions corresponding to the inside of the same opening VO of the openings VO.

In an embodiment of the disclosure, a width of each of the openings VO with respect to a lateral direction (e.g., the first direction DR1) may be greater than the sum of a length of the 1-1-th light emitting element LD1 and a length of the 2-1-th light emitting element LD2.

As described above, in the case where the partition wall PW has a mesh shape, the light emitting elements LD may be intensively disposed and aligned only in a target area of the sub-pixel SP, i.e., only in the openings VO of the partition wall PW. Hence, an abnormal alignment problem in which the light emitting elements LD are aligned in an undesired area may be prevented.

Figure 8:
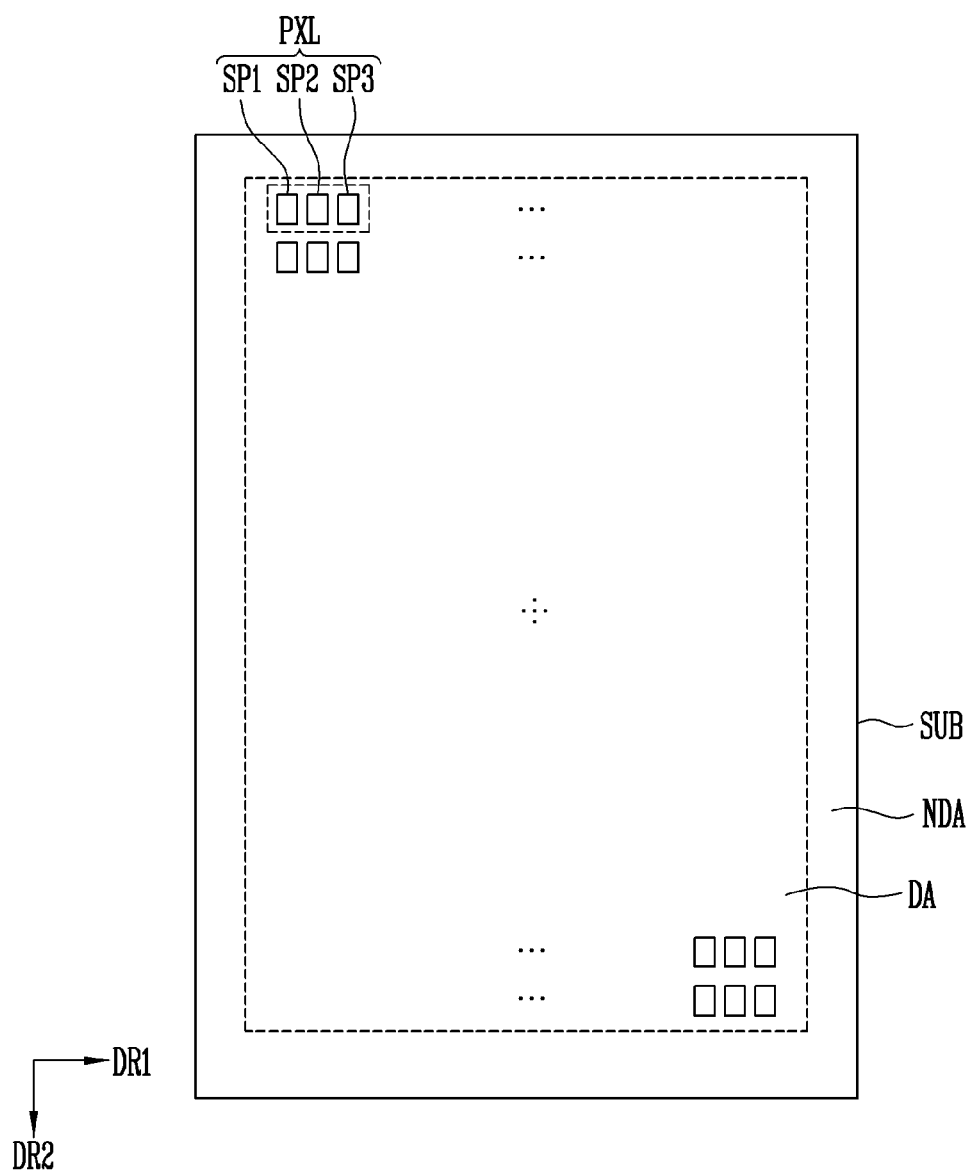
FIG. 8 illustrates a display device in accordance with an embodiment of the disclosure and is a schematic plan diagram illustrating a display device using the light emitting element illustrated in FIG. 1A as a light emitting source.

FIG. 8 illustrates a display device in accordance with an embodiment of the disclosure, and particularly, is a schematic plan diagram illustrating a display device using the light emitting element illustrated in FIG. 1A as a light emitting source.

For the sake of explanation, FIG. 8 schematically illustrates the structure of the display device, focused on a display area on which an image is displayed. In some embodiments, although not illustrated, at least one driving circuit (e.g., a scan driver and a data driver) and/or lines may be further provided in the display device.

Referring to FIGS. 1A and 8, the display device in accordance with the embodiment of the disclosure may include a substrate SUB, pixels PXL provided on the substrate SUB and each including at least one light emitting element LD, a driver (not illustrated) provided on the substrate SUB and configured to drive the pixels PXL, and a line component (not illustrated) provided to electrically connect the pixels PXL with the driver.

The display device may be classified into a passive-matrix type display device and an active-matrix type display device according to a method of driving the light emitting element LD. For example, in the case where the display device is implemented as an active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited to this, and the locations thereof may vary.

The display area DA may be an area in which the pixels PXL for displaying an image are provided. The non-display area NDA may be an area in which the driver for driving the pixels PXL and some of the line component for electrically connecting the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided on at least one side of the display area DA. In an embodiment of the disclosure, the non-display area NDA may enclose the periphery of the display area DA.

The pixels PXL may be provided in the display area DA on the substrate SUB. Each of the pixels PXL refers to a smallest unit for displaying the image, and pixels PXL may be provided.

Each of the pixels PXL may include the light emitting element LD configured to be driven in response to a corresponding scan signal and a corresponding data signal. The light emitting element LD may have a small size corresponding to a nano scale or micro scale size and may be electrically connected in parallel to light emitting elements disposed adjacent thereto. The light emitting element LD may form a light source of the corresponding pixel PXL.

The pixels PXL may be arranged in a matrix form along rows extending in a first direction DR1 and columns extending in a second direction DR2 intersecting the first direction DR1. However, the arrangement of the pixels PXL is not limited to a particular arrangement. In other words, the pixels PXL may be arranged in various forms.

The driver may provide a signal to each pixel PXL through the line component and thus control the operation of the pixel PXL. In FIG. 8, for the sake of explanation, the line component is omitted.

The driver may include a scan driver configured to provide a scan signal to the pixels PXL through a scan line, an emission driver configured to provide an emission control signal to the pixels PXL through an emission control line, a data driver configured to provide a data signal to the pixels PXL through a data line, and a timing controller. The timing controller may control the scan driver, the emission driver, and the data driver.

Figure 9A:
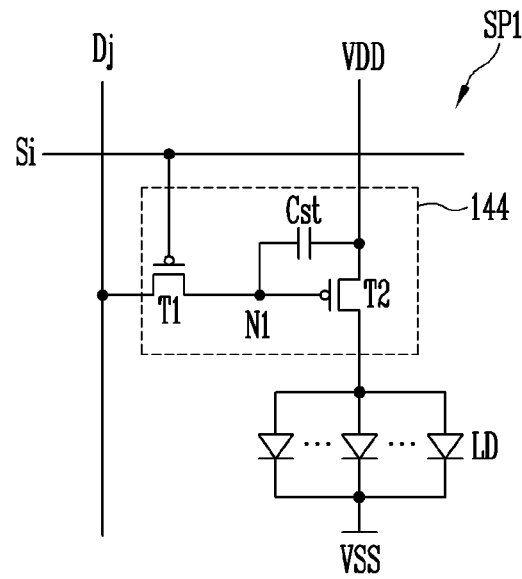
FIGS. 9A to 9C are schematic circuit diagrams illustrating examples of an emission area of the display device of FIG. 8 in accordance with various embodiments.
Figure 9B:
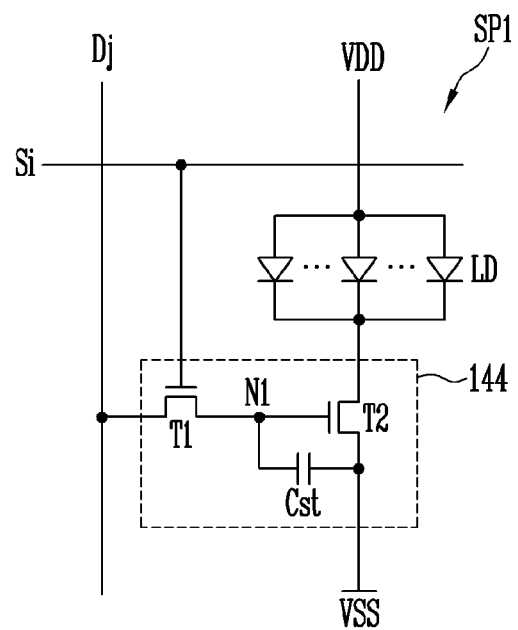
Figure 9C:
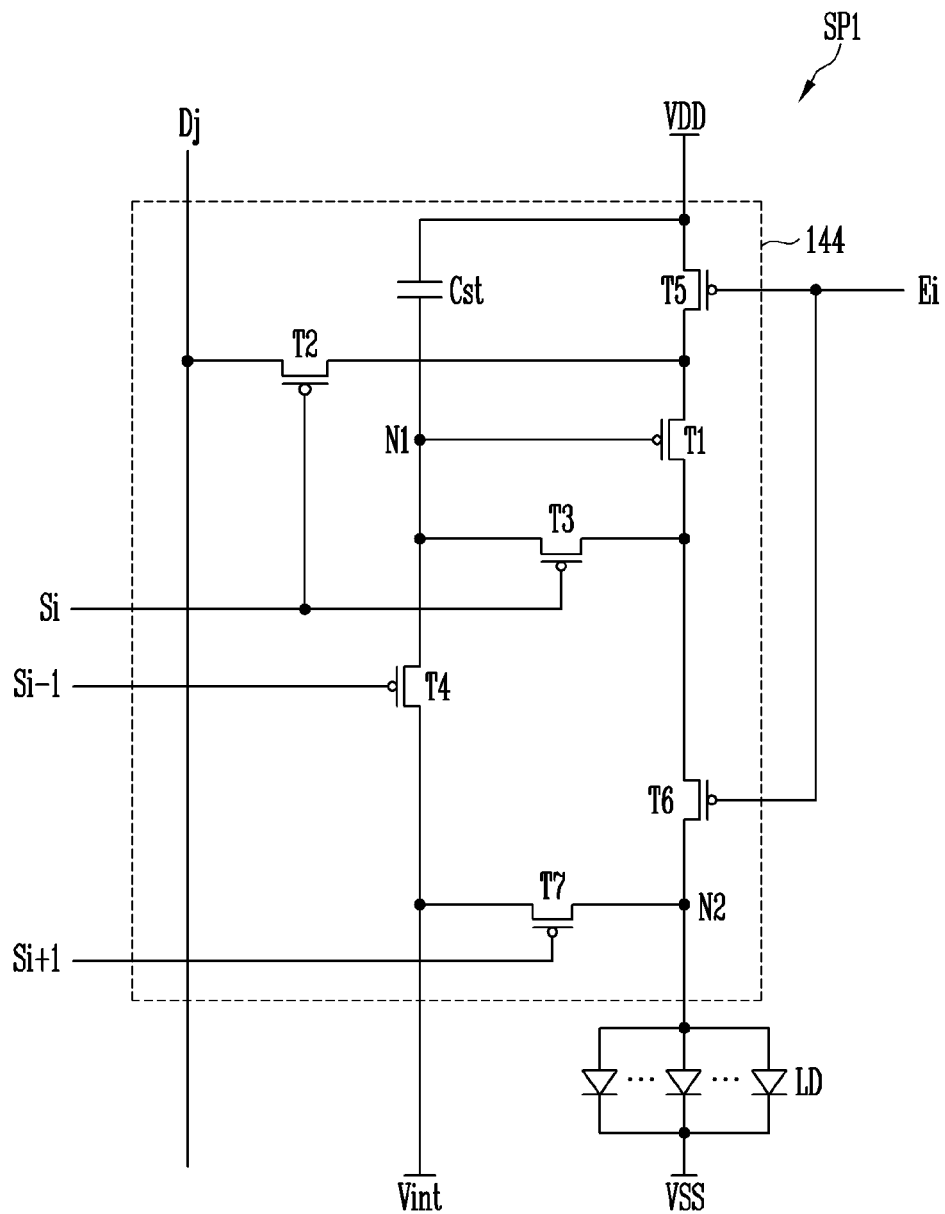

FIGS. 9A to 9C are schematic circuit diagrams illustrating examples of a unit emission area of the display device of FIG. 8 in accordance with various embodiments.

Referring to FIGS. 9A to 9C, each of the first to third sub-pixels may be configured of an active pixel. However, the type, the configuration, and/or the driving method of each of the first to third sub-pixels is not particularly limited. For example, each of the first to third sub-pixels may be configured of a pixel of a passive or active display device which can have various known structures.

Furthermore, referring to FIGS. 9A to 9C, the first to third sub-pixels may have substantially the same structure or similar structures. Hereinafter, for the sake of convenience, the first sub-pixel of the first to third sub-pixels will be described as a representative example.

Referring to FIGS. 1A, 8, and 9A, the first sub-pixel SP1 may include a plurality of light emitting elements LD electrically connected in parallel to each other between a first driving power supply VDD and a second driving power supply VSS, and a pixel driving circuit 144 configured to drive the light emitting elements LD.

Each of the light emitting elements LD may include a first electrode (e.g., an anode electrode) electrically connected to a first driving power supply VDD via the pixel driving circuit 144, and a second electrode (e.g., a cathode electrode) electrically connected to a second driving power supply VSS.

The first driving power supply VDD and the second driving power supply VS S may have different potentials. For example, the second driving power supply VSS may have a potential lower than that of the first driving power supply VDD by a value equal to or greater than a threshold voltage of the light emitting elements LD.

Each of the light emitting elements LD may emit light at a luminance corresponding to driving current that is controlled by the pixel driving circuit 144.

Although FIGS. 9A to 9C illustrate embodiments in which the light emitting elements LD are electrically connected in parallel to each other in the same direction (e.g., a forward direction) between the first and second driving power supplies VDD and VSS, the disclosure is not limited thereto. For example, in an embodiment, some of the light emitting elements LD may be electrically connected in forward direction between the first and second driving power supplies VDD and VSS, and the other light emitting elements LD may be electrically connected in a reverse direction. One of the first and second driving power supplies VDD and VSS may be supplied in the form of alternating voltage. In this case, groups of the light emitting elements LD connected in an identical direction may alternately emit light. In an embodiment, the first sub-pixel SP1 may include a single light emitting element LD.

In an embodiment of the disclosure, the pixel driving circuit 144 may include first and second transistors T1 and T2, and a storage capacitor Cst. However, the structure of the pixel driving circuit 144 is not limited to the embodiment illustrated in FIG. 9A.

The first transistor T1 (switching transistor) includes a first electrode electrically connected to a data line Dj, and a second electrode electrically connected to a first node N1. Here, the first electrode and the second electrode of the first transistor T1 may be different electrodes. For example, if the first electrode is a source electrode, the second electrode is a drain electrode. The first transistor T1 may include a gate electrode electrically connected to the scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The storage capacitor Cst is charged by the data signal transmitted to the first node N1.

The second transistor T2 (driving transistor) may include a first electrode electrically connected to the first driving power supply VDD, and a second electrode electrically connected to the first electrode of each of the light emitting elements LD. The second transistor T2 may include a gate electrode electrically connected to the first node N1. The second transistor T2 may control the amount of driving current to be supplied to the light emitting elements LD in response to the voltage of the first node N1.

One electrode of the storage capacitor Cst is electrically connected to the first driving power supply VDD, and the other electrode thereof is electrically connected to the first node N1. The storage capacitor Cst may be charged with a voltage corresponding to the data signal supplied to the first node N1 and may maintain the charged voltage until a data signal of a subsequent frame is supplied.

For the sake of explanation, FIG. 9A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the disclosure is not limited to the foregoing structure, and the structure of the pixel driving circuit 144 may vary. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting element LD, or other circuit elements such as a boosting capacitor for boosting the voltage of the first node N1.

Although in FIG. 9A the transistors, e.g., the first and second transistors T1 and T2, included in the pixel driving circuit 144 have been illustrated as being P-type transistors, the disclosure is not limited to this. In other words, at least one of the first and second transistors T1 and T2 included in the pixel driving circuit 144 may be an N-type transistor. Referring to FIGS. 1A, 8, and 9B, the first and second transistors T1 and T2 in accordance with an embodiment of the disclosure may be N-type transistors. The configuration and operation of the pixel driving circuit 144 illustrated in FIG. 9B, other than a change in connection positions of some components due to a change in the type of transistor, are similar to those of the pixel driving circuit 144 of FIG. 9A. Therefore, detailed descriptions pertaining to this will be omitted.

In an embodiment of the disclosure, the configuration of the pixel driving circuit 144 is not limited to the embodiments illustrated in FIGS. 9A and 9B. For example, the pixel driving circuit 144 may be configured in the same manner as that of an embodiment illustrated in FIG. 9C.

Referring to FIGS. 1A, 8, and 9C, the pixel driving circuit 144 may be electrically connected to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be electrically connected to an i-th scan line Si and a j-th data line Dj of the display area DA.

In an embodiment, the pixel driving circuit 144 may be further electrically connected to at least one scan line. For example, the sub-pixel SP1 disposed on the i-th row of the display area DA may be further electrically connected to an i−1-th scan line Si−1 and/or an i+1-th scan line Si+1.

In an embodiment, the pixel driving circuit 144 may be electrically connected not only to the first and second driving power supplies VDD and VSS but also to a third power supply. For example, the pixel driving circuit 144 may also be electrically connected to an initialization power supply Vint.

Here, the pixel driving circuit 144 may include first to seventh transistors T1 to T7, and a storage capacitor Cst.

The first transistor T1 (driving transistor) may include a first electrode, e.g., a source electrode, electrically connected to the first driving power supply VDD via the fifth transistor T5, and a second electrode, e.g., a drain electrode, electrically connected to one end of the light emitting elements LD via the sixth transistor T6. The first transistor T1 may include a gate electrode electrically connected to a first node N1. The first transistor T1 may control driving current flowing between the first driving power supply VDD and the second driving power supply VSS via the light emitting elements LD in response to the voltage of the first node N1.

The second transistor T2 (switching transistor) may be connected between the j-th data line Dj electrically connected to the first sub-pixel SP1 and the source electrode of the first transistor T1. A gate electrode of the second transistor T2 is electrically connected to the i-th scan line Si connected to the first sub-pixel SP1. In case that a scan signal having a gate-on voltage (e.g., a low-level voltage) is supplied from the i-th scan line Si, the second transistor T2 is turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 is connected between the drain electrode of the first transistor T1 and the first node N1. The third transistor T3 may include a gate electrode electrically connected to the i-th scan line Si. In case that a scan signal having a gate-on voltage is supplied from the scan line Si, the third transistor T3 may be turned on to electrically connect the drain electrode of the first transistor T1 to the first node N1. Therefore, in case that the third transistor T3 is turned on, the first transistor T1 may be diode-connected.

The fourth transistor T4 is connected between the first node N1 and the initialization power supply Vint. A gate electrode of the fourth transistor T4 is electrically connected to a preceding scan line, e.g., an i−1-th scan line Si-1. In case that a scan signal of a gate-on voltage is supplied to the i−1-th scan line Si-1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 is connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei and may be turned on in other cases.

The sixth transistor T6 is connected between the first transistor T1 and a second node N2, which is electrically connected to first ends of the light emitting elements LD. A gate electrode of the sixth transistor T6 is electrically connected to the i-th emission control line Ei. The sixth transistor T6 may be turned off in case that an emission control signal having a gate-off voltage is supplied to the i-th emission control line Ei and may be turned on in other cases.

The seventh transistor T7 is connected between the second node N2, which is electrically connected to the first ends of the light emitting elements LD and the initialization power supply Vint. A gate electrode of the seventh transistor T7 is electrically connected to any one of the scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first ends of the light emitting elements LD.

The storage capacitor Cst may be connected between the first driving power supply VDD and the first node N1. The storage capacitor Cst may store a voltage corresponding to the threshold voltage of the first transistor T1 and/or the data signal applied to the first node N1 during each frame period.

For the sake of convenience, FIG. 9C illustrates that all of the first to seventh transistors T1 to T7 are P-type transistors, but the disclosure is not limited thereto. For example, at least one of the first to seventh transistors T1 to T7 included in the pixel driving circuit 144 may be an N-type transistor, or all of the first to seventh transistors T1 to T7 may be N-type transistors.

Figure 10:
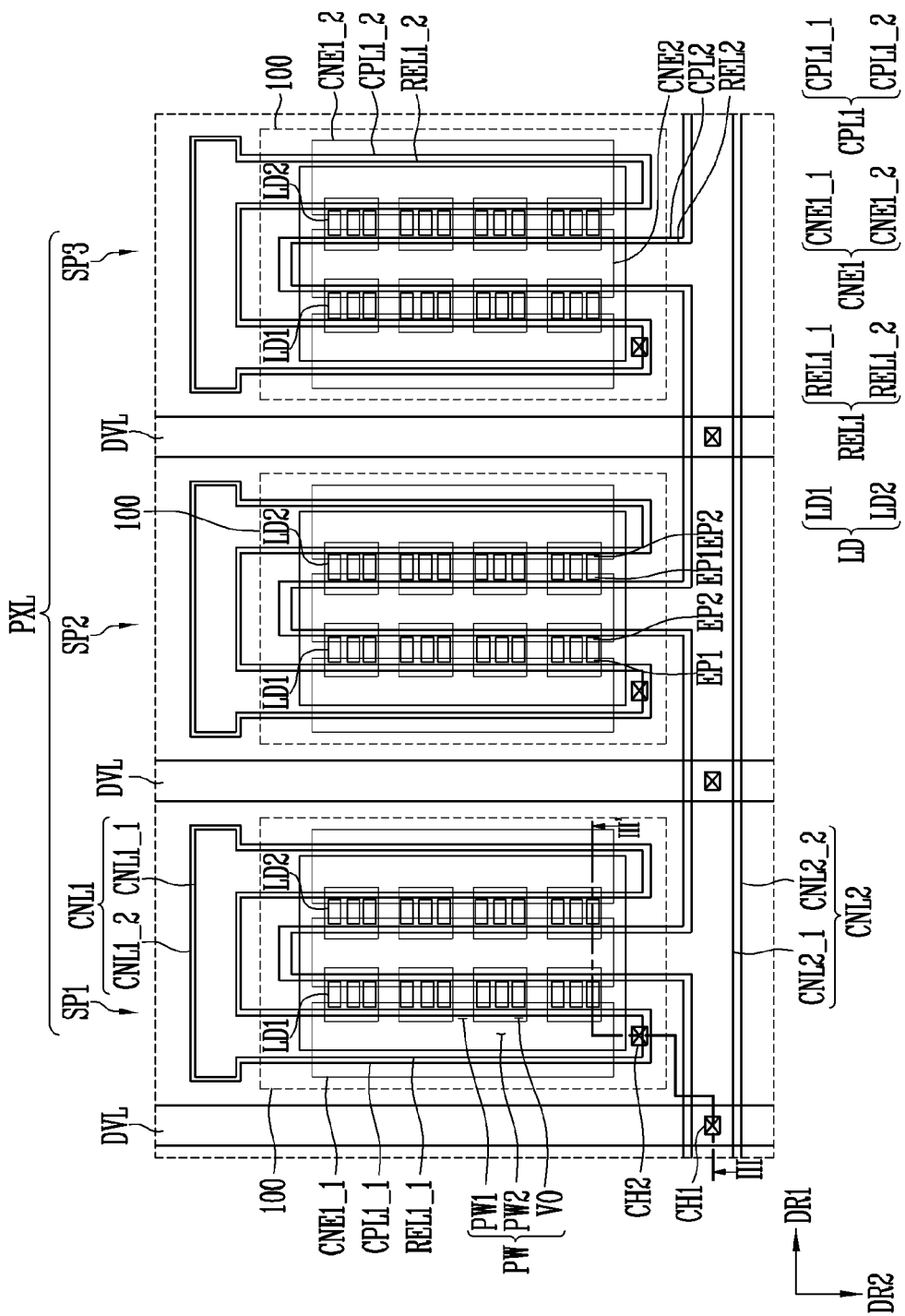
FIG. 10 is a schematic plan diagram illustrating one of the pixels shown in FIG. 8.
Figure 11:
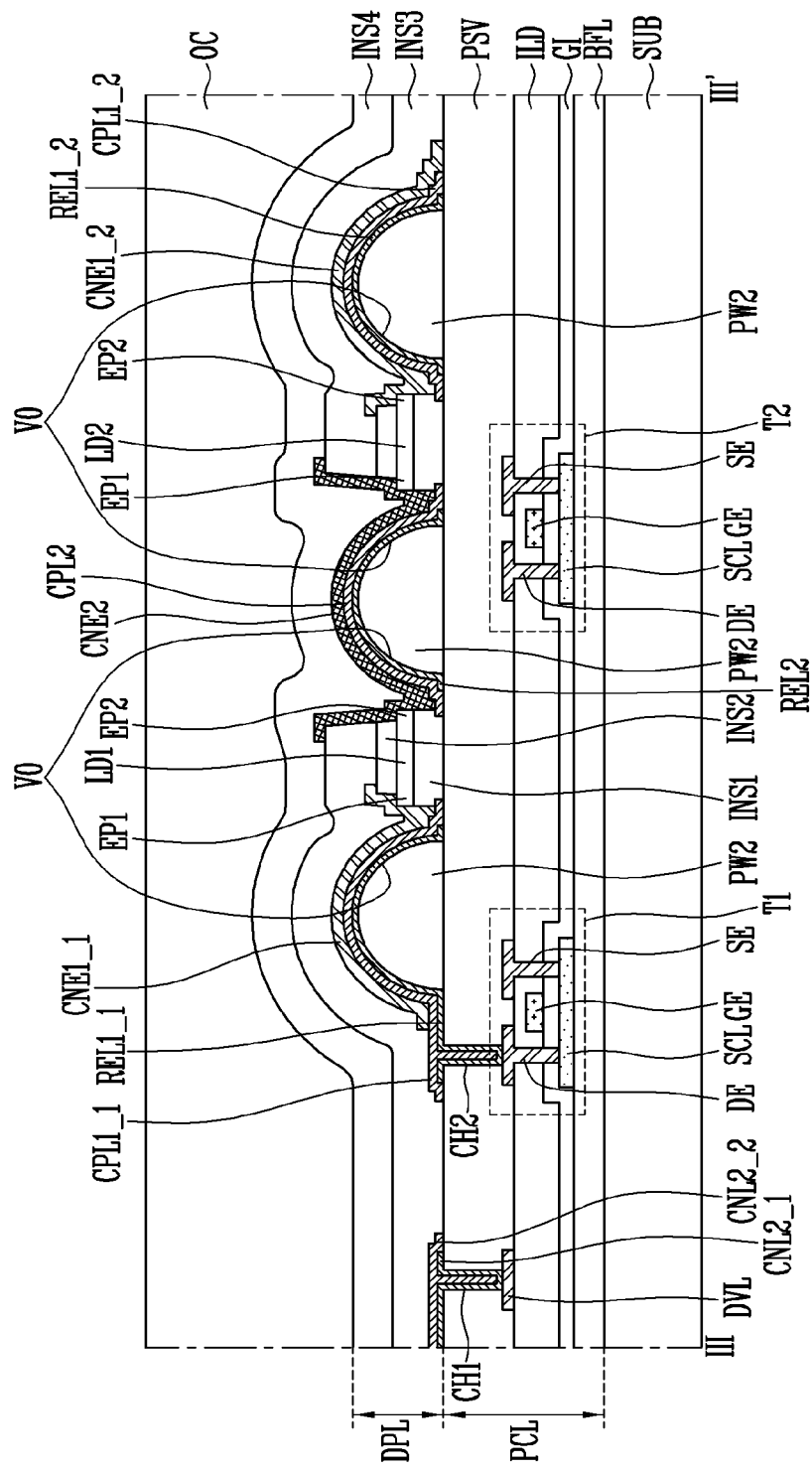
FIG. 11 is a schematic sectional diagram taken along line of FIG. 10.

FIG. 10 is a schematic plan diagram schematically illustrating one of the pixels illustrated in FIG. 8. FIG. 11 is a schematic sectional diagram taken along line of FIG. 10.

In an embodiment of the disclosure, the following description will be focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

In FIG. 10, for the sake of explanation, light emitting elements provided in each sub-pixel are illustrated as being horizontally arranged. However, the arrangement of the light emitting elements is not limited thereto. For example, at least some of the light emitting elements may be arranged in a direction intersecting the horizontal direction.

For the sake of explanation, illustration of transistors electrically connected to the light emitting elements, and signal lines electrically connected to the transistors has been omitted in FIG. 10.

Moreover, although FIGS. 10 and 11 schematically illustrate a simplified structure of the one pixel, e.g., by showing that each electrode has only a single electrode layer, the disclosure is not limited thereto.

Referring to FIGS. 1A, 3A, 8, 10, and 11, the display device in accordance with an embodiment of the disclosure may include a substrate SUB on which pixels PXL are provided. Each of the pixels PXL may include a first sub-pixel SP1, a second sub-pixel SP2, and a third sub-pixel SP3 which are provided on the substrate SUB.

The unit emission area 100 of each of the first to third sub-pixels SP1, SP2, and SP3 may include the substrate SUB, a pixel circuit layer PCL provided on the substrate SUB, and a display element layer DPL provided on the pixel circuit layer PCL.

In an embodiment of the disclosure, the unit emission area 100 may include a pixel area of a corresponding sub-pixel. For example, the unit emission area 100 of the first sub-pixel SP1 may include a pixel area of the first sub-pixel SP1. The unit emission area 100 of the second sub-pixel SP2 may include a pixel area of the second sub-pixel SP2. The unit emission area 100 of the third sub-pixel SP3 may include a pixel area of the third sub-pixel SP3.

The pixel circuit layer PCL of each sub-pixel may include a buffer layer BFL disposed on the substrate SUB, first and second transistors T1 and T2 disposed on the buffer layer BFL, and a driving voltage line DVL. The pixel circuit layer PCL of each sub-pixel may further include a passivation layer PSV which is provided on the first and second transistors T1 and T2 and the driving voltage line DVL.

The display element layer DPL of each sub-pixel may include a partition wall PW, first and second electrodes REL1 and REL2, first and second connection lines CNL1 and CNL2, light emitting elements LD, and first and second contact electrodes CNE1 and CNE2 which are provided on the passivation layer PSV.

For the sake of convenience, the display element layer DPL of each sub-pixel will be described after the pixel circuit layer PCL of each sub-pixel is described.

The substrate SUB may include an insulating material such as glass, an organic polymer, or crystal. The substrate SUB may be made of material having flexibility so as to be bendable or foldable and may have a single-layer or multi-layer structure.

The buffer layer BFL may be provided on the substrate SUB and may prevent impurities from diffusing into the first and second transistors T1 and T2. The buffer layer BFL may be provided in a single-layer structure or a multi-layer structure having at least two or more layers. In the case where the buffer layer BFL has a multi-layer structure, the respective layers may be formed of the same material or different materials. The buffer layer BFL may be omitted depending on the material of the substrate SUB or processing conditions.

The first transistor T1 may be a driving transistor that is electrically connected to some of the light emitting elements LD provided in the display element layer DPL to drive the corresponding light emitting element LD. The second transistor T2 may be a switching transistor configured to switch the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a first area which comes into contact with the source electrode SE, and a second area which comes into contact with the drain electrode DE. An area between the first area and the second area may be a channel area. In an embodiment of the disclosure, the first area may be any one of a source area and a drain area, and the second area may be the other area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with impurities.

The gate electrode GE may be provided on the semiconductor layer SCL with a gate insulating layer GI interposed therebetween.

The source electrode SE and the drain electrode DE may respectively come into contact with the first area and the second area of the semiconductor layer SCL through corresponding contact holes that pass through an interlayer insulating layer ILD and the gate insulating layer GI.

The driving voltage line DVL may be provided on the interlayer insulating layer ILD, but it is not limited thereto. In some embodiments, the driving voltage line DVL may be provided on any one of insulating layers included in the pixel circuit layer PCL. The second driving power supply VSS may be applied to the driving voltage line DVL.

The passivation layer PSV may include a first contact hole CH1 in which the driving voltage line DVL is exposed, and a second contact hole CH2 in which the drain electrode DE of the first transistor T1 is exposed.

The partition wall PW may be provided on the passivation layer PSV and may define the unit emission area 100 of each of the sub-pixels. The partition wall PW may include an inorganic insulating layer formed of inorganic material or an organic insulating layer formed of organic material.

The partition wall PW may include first partition walls PW1 extending in a first direction DR1, and second partition walls PW2 extending in a second direction DR2 intersecting the first direction DR1. The partition wall PW may have a mesh shape by the first partition walls PW1 and the second partition walls PW2.

The partition wall PW having a mesh shape may have openings VO. Each of the openings VO may be an area formed by causing the first partition walls PW1 and the second partition walls PW2 to intersect each other. Each of the openings VO may expose a portion of the passivation layer PSV that corresponds to an area in which the light emitting elements LD are aligned in the unit emission area 100 of each of the sub-pixels.

One opening VO of the openings VO may be an area formed by causing two second partition walls PW2 adjacent to each other in the second direction DR2 to intersect two first partition walls PW1 adjacent to each other in the first direction DR1.

In an embodiment of the disclosure, the first partition walls PW1 and the second partition walls PW2 may be connected with each other and may overlap the first electrode REL1 and the second electrode REL2, in a plan view. The first partition walls PW1 and the second partition walls PW2 may be integrally provided, may be disposed on the same plane of the substrate SUB, and may have the same height.

As illustrated in FIG. 11, each of the second partition walls PW2 may include a curved surface having a cross-sectional shape such as a semi-circle, or a semi-ellipse, the width of which reduces from one surface of the substrate SUB toward an upper end thereof, but the disclosure is not limited thereto.

In an embodiment of the disclosure, the light emitting elements LD may be aligned between the first electrode REL1 and the second electrode REL2 at positions corresponding to the insides of the openings VO. In a plan view, the light emitting elements LD may be provided on the passivation layer PSV at a position corresponding to the inside of each of the openings VO.

The first electrode REL1 and the second electrode REL2 may reflect light emitted from the opposite ends EP1 and EP2 of each of the light emitting elements LD in a direction (e.g., in a frontal direction) in which an image of the display device is displayed.

The first electrode REL1 and the second electrode REL2 each may be provided on the corresponding partition wall PW2. Each of the first electrode REL1 and the second electrode REL2 may have a shape corresponding to the shape of the corresponding partition wall PW2.

The first electrode REL1 and the second electrode REL2 may function as alignment electrodes for aligning the light emitting elements LD in the corresponding openings VO of the unit emission area 100 of each sub-pixel. To this end, a first alignment voltage may be applied to the first electrode REL1 through the first connection line CNL1, and a second alignment voltage may be applied to the second electrode REL2 through the second connection line CNL2.

In an embodiment of the disclosure, the first electrode REL1 may be electrically connected to the drain electrode DE of the first transistor T1 through the second contact hole CH2 of the passivation layer PSV. Hence, a signal supplied to the first transistor T1 may be transmitted to the first electrode REL1.

The second electrode REL2 may be electrically connected to the driving voltage line DVL through the first contact hole CH1 of the passivation layer PSV. Consequently, the second driving power supply VSS of the driving voltage line DVL may be transmitted to the second electrode REL2.

The first connection line CNL1 provided in the first sub-pixel SP1 may be electrically separated from the first connection line CNL1 provided in the second sub-pixel SP2 disposed adjacent to the first sub-pixel SP1. The first connection line CNL1 provided in the second sub-pixel SP2 may be electrically separated from a first connection line CNL1 provided in the third sub-pixel SP3 disposed adjacent to the second sub-pixel SP2. Hence, the first connection line CNL1 provided in one sub-pixel may be electrically separated from the first connection line CNL1 provided in a sub-pixel disposed adjacent to the one sub-pixel. Thus, each of the first to third sub-pixels SP1 to SP3 may be individually driven.

The second connection line CNL2 provided in the first sub-pixel SP1 may be provided in common in the second and third sub-pixels SP2 and SP3 disposed adjacent to the first sub-pixel SP1. In other words, the first to third sub-pixels SP1, SP2, and SP3 may be electrically connected in common to the second connection line CNL2.

The first contact electrode CNE1 may be provided on the first electrode REL1 to electrically and/or physically and reliably connect the first electrode REL1 with one end of the opposite ends EP1 and EP2 of each of the light emitting elements LD. In an embodiment of the disclosure, a first capping layer CPL1 may be provided between the first electrode REL1 and the first contact electrode CNE1. However, the disclosure is not limited to the foregoing example. In some embodiments, the first capping layer CPL1 may be omitted. In the case where the first capping layer CPL1 is omitted, the first contact electrode CNE1 may be directly provided on the first electrode REL1.

The second contact electrode CNE2 may be provided on the second electrode REL2 to electrically and/or physically and reliably connect the second electrode REL2 with the other end of the opposite ends EP1 and EP2 of each of the light emitting elements LD. In an embodiment of the disclosure, a second capping layer CPL2 may be provided between the second electrode REL2 and the second contact electrode CNE2. However, the disclosure is not limited to the foregoing example. In some embodiments, the second capping layer CPL2 may be omitted. In the case where the second capping layer CPL2 is omitted, the second contact electrode CNE2 may be directly provided on the second electrode REL2.

As described above, predetermined voltages may be respectively applied to the opposite ends EP1 and EP2 of each of the light emitting elements LD through the first electrode REL1 and the second electrode REL2. Hence, each of the light emitting elements LD may emit light by coupling of electron-hole pairs in the active layer 12 of each of the light emitting elements LD. Light emitted from the opposite ends EP1 and EP2 of each of the light emitting elements LD may be moved to the first electrode REL1 and the second electrode REL2 and may be reflected in the frontal direction. Hence, the display device may display an image corresponding to the light.

In an embodiment of the disclosure, in case that the light emitting elements LD are aligned in the unit emission area 100 of each of the sub-pixels by forming an electric field between the first and second electrodes REL1 and REL2, the light emitting elements LD may be intensively disposed and aligned in each of the openings VO thanks to the mesh-shaped partition wall PW provided in each of the sub-pixels. Hence, the alignment distribution of the light emitting elements LD in each of the sub-pixels is uniformized, the efficiencies of light emitted from the light emitting elements LD of each sub-pixel may be substantially equal or similar to each other. Therefore, the display device may have uniform light emitting distribution on the overall area thereof.

In an embodiment of the disclosure, the partition wall PW is designed to have a mesh shape, so that the light emitting elements LD may be intensively disposed and aligned in a target area of each of the sub-pixels, in other words, only in each of the openings VO of the partition wall PW. Hence, an abnormal alignment defect in which the light emitting elements LD are aligned in an undesired area may be prevented.

Figure 12:
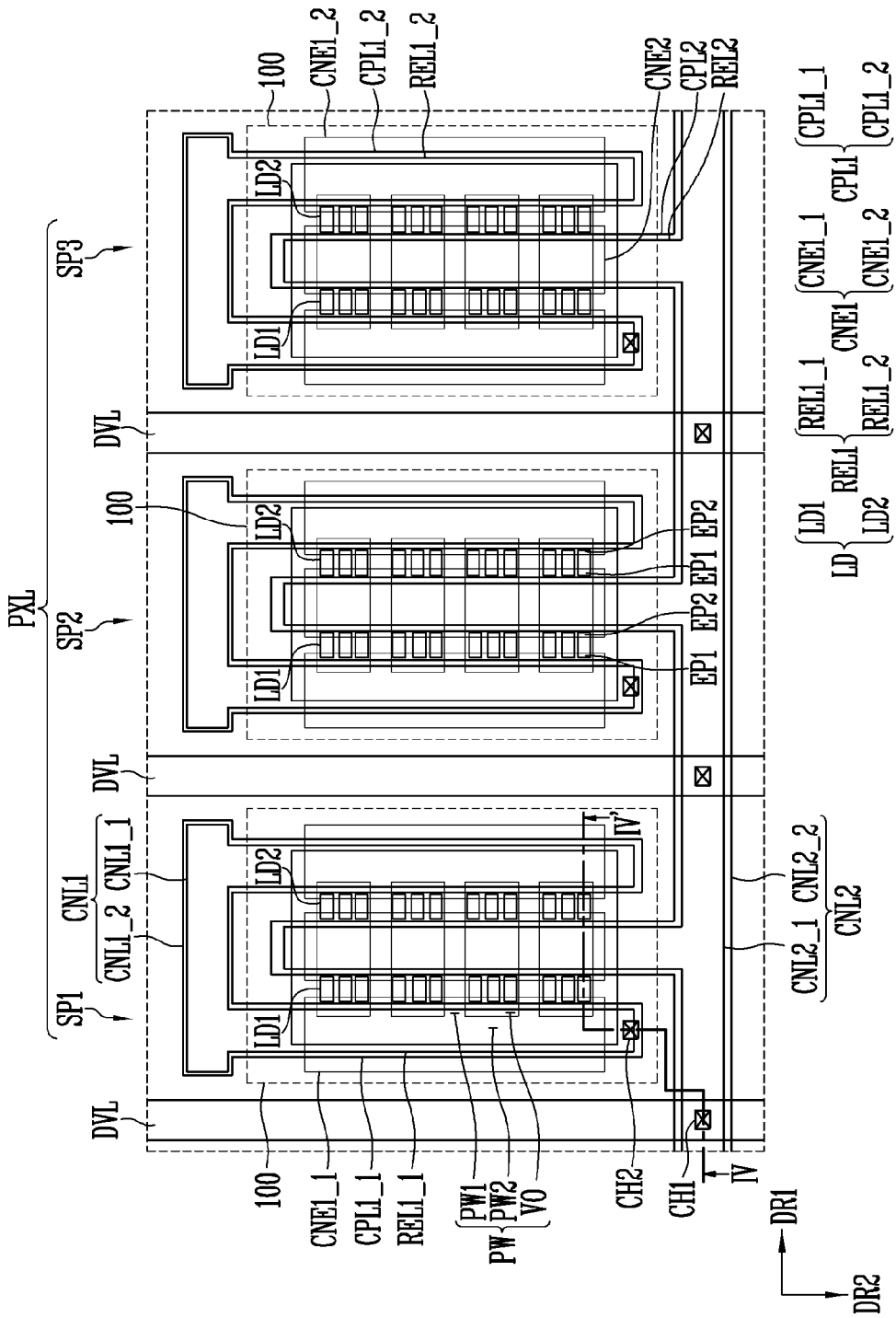
FIG. 12 is a schematic plan diagram illustrating one of the pixels shown in FIG. 8 in accordance with an embodiment.
Figure 13:
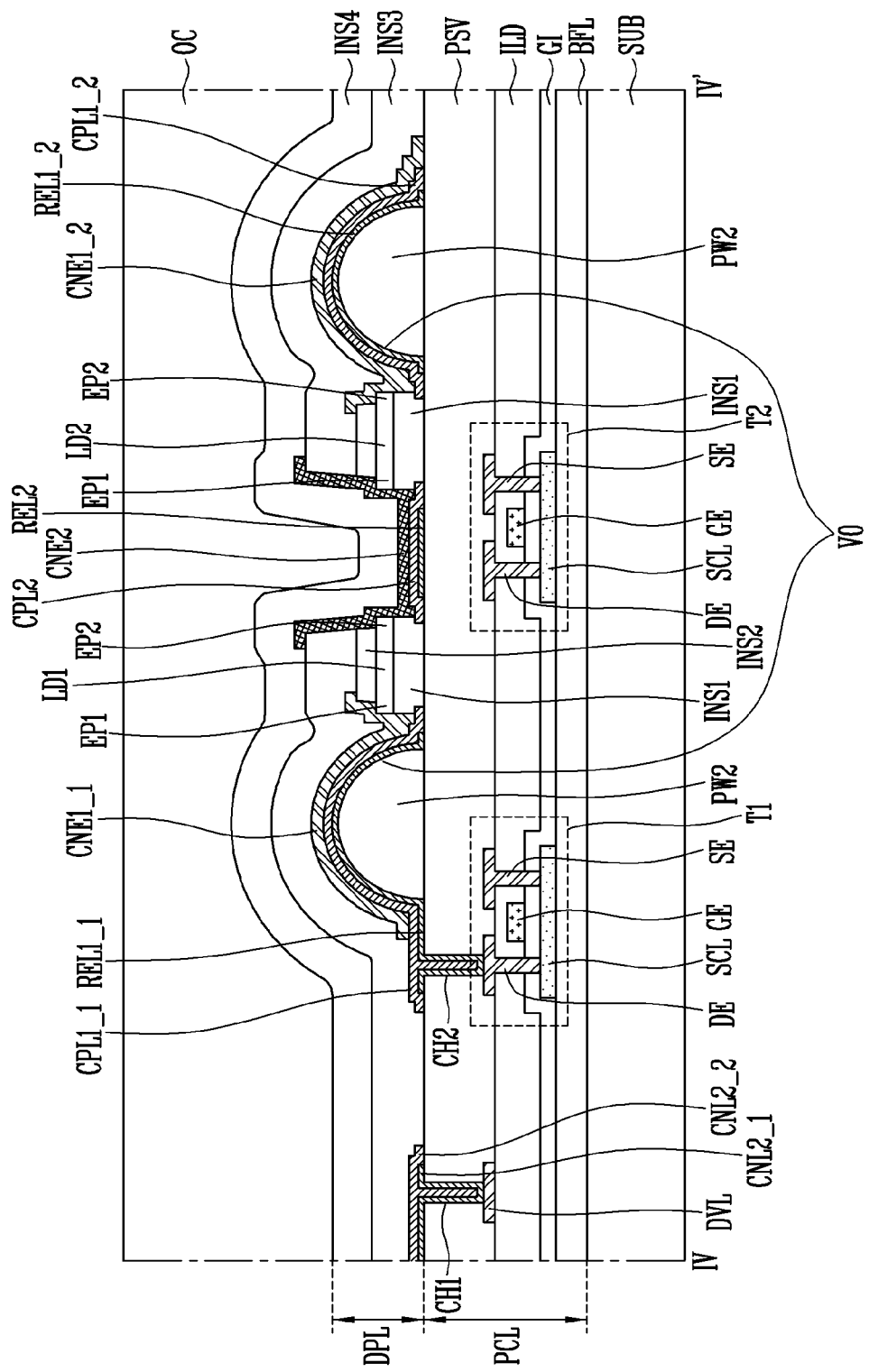
FIG. 13 is a schematic sectional diagram taken along line IV-IV' of FIG. 12.

FIG. 12 is a schematic plan diagram illustrating an embodiment of one pixel of FIG. 8. FIG. 13 is a schematic sectional diagram taken along line IV-IV' of FIG. 12.

In an embodiment of the disclosure, the following description will be focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

The configuration of the display device illustrated in FIG. 12, other than the fact that a first electrode and a second electrode are disposed on different planes, may have substantially the same as or similar to that of the light emitting device of FIG. 10.

Although for the sake of convenience, FIG. 12 illustrates that a plurality of light emitting elements are aligned in a horizontal direction, the alignment of the light emitting elements is not limited thereto. In some embodiments, the light emitting elements may be aligned in a direction intersecting the horizontal direction.

For the sake of explanation, illustration of transistors electrically connected to the light emitting elements, and signal lines electrically connected to the transistors has been omitted in FIG. 12.

Although FIGS. 12 and 13 illustrate a simplified structure, e.g., of the one pixel showing that each electrode has only a single electrode layer, the disclosure is not limited thereto.

Referring to FIGS. 1A, 2, 3A, 8, 12, and 13, the display device in accordance with an embodiment of the disclosure may include a substrate SUB on which pixels PXL are provided. Each of the pixels PXL may include first to third sub-pixels SP1, SP2, and SP3 provided on the substrate SUB.

The unit emission area 100 of each of the first to third sub-pixels SP1, SP2, and SP3 may include the substrate SUB, a pixel circuit layer PCL provided on the substrate SUB, and a display element layer DPL provided on the pixel circuit layer PCL.

The display element layer DPL of each sub-pixel may include a partition wall PW, first and second electrodes REL1 and REL2, first and second connection lines CNL1 and CNL2, a plurality of light emitting elements LD, and first and second contact electrodes CNE1 and CNE2 which are provided on the pixel circuit layer PCL of each of the sub-pixels.

The first electrode REL1 may include a 1-1-th electrode REL1_1 and a 1-2-th electrode REL1_2 which diverge from a 1-1-th connection line CNL1_1 of the first connection line CNL1 in a second direction DR2. The second electrode REL2 may diverge from a 2-1-th connection line CNL2_1 of the second connection line CNL2 in the second direction DR2.

The partition wall PW may be provided on the substrate SUB and define the unit emission area 100 of each of the sub-pixels. The partition wall PW may include an inorganic insulating layer formed of inorganic material or an organic insulating layer formed of organic material.

The partition wall PW may include first partition walls PW1 extending in a first direction DR1, and second partition walls PW2 extending in a second direction DR2 intersecting the first direction DR1. The partition wall PW may have a mesh shape by the first partition walls PW1 and the second partition walls PW2.

The partition wall PW having a mesh shape may have openings VO. Each of the openings VO may be an area formed by causing the first partition walls PW1 and the second partition walls PW2 to intersect each other. Each of the openings VO may expose a portion of the passivation layer PSV that corresponds to an area in which the light emitting elements LD are aligned in the unit emission area 100 of each of the sub-pixel.

One opening VO of the openings VO may be an area formed by causing two second partition walls PW2 adjacent to each other in the second direction DR2 to intersect two first partition walls PW1 adjacent to each other in the first direction DR1.

The first partition walls PW1 and the second partition walls PW2 may be integrally provided, may be disposed on the same plane of the substrate SUB, and may have the same height. Each of the second partition walls PW2 may include a curved surface having a cross-sectional shape such as a semi-circle, or a semi-ellipse, the width of which reduces from one surface of the substrate SUB toward an upper end thereof. Each of the first partition walls PW1 and each of the second partition wall PW2 may have substantially the same cross-section.

In an embodiment of the disclosure, each of the first partition walls PW1 may overlap the first electrode REL1 and the second electrode REL2, in a plan view. Each of the second partition walls PW2 may overlap only the first electrode REL1, in a plan view. In other words, only the first electrode REL1 may be provided on only the corresponding second partition walls PW2. For example, the 1-1-th electrode REL1_1 may be provided on one second partition wall PW2 (hereinafter, referred to as '2-1-th partition wall') of the second partition walls PW2. The 1-2-th electrode REL1_2 may be provided on one second partition wall PW2 (hereinafter, referred to as '2-2-th partition wall') adjacent to the 2-1-th partition wall PW.

As illustrated in FIG. 12, the second electrode REL2 may overlap the openings VO of the partition wall PW provided between the 2-1-th partition wall PW2 and the 2-2-th partition wall PW2. The second electrode REL2 may be disposed on the passivation layer PSV in the openings VO of the partition wall PW.

The first electrode REL1 may be provided on the corresponding second partition wall PW2. The second electrode REL2 may be provided on the passivation layer PSV in the openings VO of the partition wall PW. Therefore, the first electrode REL1 and the second electrode REL2 are provided on different layers, i.e., on different planes rather than on the same plane.

The light emitting elements LD may be aligned between the first electrode REL1 and the second electrode REL2 at positions corresponding to the insides of the openings VO. In a plan view, the light emitting elements LD may be provided on the passivation layer PSV at a position corresponding to the inside of each of the opening VO.

As described above, in the case where the partition wall PW has a mesh shape, the light emitting elements LD may be intensively disposed and aligned only in a target area of each of the sub-pixels, i.e., only in each of the openings VO of the partition wall PW. Hence, an abnormal alignment problem in which the light emitting elements LD are aligned in an undesired area may be prevented.

The display device in accordance with an embodiment of the disclosure may be employed in various electronic devices. For instance, the display device may be applied to a television, a notebook computer, a cellular phone, a smartphone, a smartpad, a portable multimedia player (PMP), a personal digital assistant (PDA), a navigation device, various kinds of wearable devices such as a smartwatch, etc.

While various embodiments have been described above, those of ordinary skill in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the disclosure must be defined by the accompanying claims.

What is claimed is:

1. A light emitting device comprising:
   a substrate including a plurality of emission areas;
   a first electrode disposed on the substrate;
   a second electrode disposed on the substrate and spaced apart from the first electrode;
   a plurality of light emitting elements disposed on the substrate, each of the plurality of light emitting elements including a first end and a second end in a longitudinal direction of the plurality of light emitting elements;
   a bank disposed in each of the plurality of emission areas, having a mesh shape in a plan view, and including a plurality of openings in which portions of the plurality of emission areas are exposed;
   a first contact electrode that electrically connects the first electrode with the first end of each of the plurality of light emitting elements; and
   a second contact electrode that electrically connects the second electrode with the second end of each of the plurality of light emitting elements,
   wherein at least one of the plurality of light emitting elements is disposed in each of the openings.

2. The light emitting device according to claim 1, wherein the bank comprises:
   a plurality of first banks extending in a first direction; and
   a plurality of second banks extending in a second direction intersecting the first direction, and each of the plurality of openings includes an area formed between a part of the plurality of first banks and a part of the plurality of second banks.

3. The light emitting device according to claim 2, wherein the plurality of openings are disposed between the first electrode and the second electrode, in a plan view.

4. The light emitting device according to claim 3, wherein the at least one of the plurality of light emitting elements are aligned on the substrate in each of the plurality of openings by an electric field formed between the first electrode and the second electrode.

5. The light emitting device according to claim 4, wherein a lateral width and a longitudinal width of each of the plurality of openings are greater than a length of each of the plurality of light emitting elements.

6. The light emitting device according to claim 5, wherein the plurality of second banks overlap each of the first and the second electrodes, in a plan view.

7. The light emitting device according to claim 6, wherein each of the first electrode and the second electrode is disposed on a second bank of the plurality of the second banks corresponding to each of the first electrode and the second electrode.

8. The light emitting device according to claim 7, wherein the first electrode and the second electrode are disposed on a same layer and spaced apart from each other.

9. The light emitting device according to claim 5, wherein a second bank of the plurality of second banks overlaps the first electrode, in a plan view.

10. The light emitting device according to claim 9, wherein the first electrode and the second electrode are disposed on different layers and spaced apart from each other.

11. The light emitting device according to claim 5, wherein each of the plurality of light emitting elements comprises:
    a first semiconductor layer doped with a first conductive dopant;
    a second semiconductor layer doped with a second conductive dopant; and
    an active layer disposed between the first semiconductor layer and the second semiconductor layer.

12. The light emitting device according to claim 11, wherein each of the plurality of light emitting elements includes a light emitting diode having a shape of a cylinder or polyprism having a micro-scale or nano-scale size.

13. A display device comprising:
    a substrate including a display area and a non-display area; and
    a plurality of pixels disposed in the display area each of the plurality of pixels including a plurality of sub-pixels,
    wherein each of the plurality of sub-pixels comprises:
    a pixel circuit layer including at least one transistor, and
    a display element layer including an emission area through which light is emitted,
    wherein the display element layer comprises:
      a first electrode disposed on the pixel circuit layer;
      a second electrode disposed at a position spaced apart from the first electrode;
      a plurality of light emitting elements disposed on the pixel circuit layer, each of the plurality of light emitting elements including a first end and a second end in a longitudinal direction of the plurality of light emitting elements;
      a bank disposed on the pixel circuit layer, having a mesh shape in a plan view, and including a plurality of openings in which portions of the emission area of each of the plurality of sub-pixels are exposed;
      a first contact electrode that electrically connects the first electrode with the first end of each of the plurality of light emitting elements; and
      a second contact electrode that electrically connects the second electrode with the second end of each of the plurality of light emitting elements, and
    wherein at least one of the plurality of light emitting elements is disposed in each of the plurality of openings.

14. The display device according to claim 13, wherein the bank comprises:
    a plurality of first banks extending in a first direction; and
    a plurality of second banks extending in a second direction intersecting the first direction, and
    each of the plurality of openings includes an area formed between a part of the plurality of first banks and a part of the plurality of second banks.

15. The display device according to claim 14, wherein the plurality of openings are disposed between the first electrode and the second electrode, in a plan view.

16. The display device according to claim 15, wherein the at least one of the plurality of light emitting elements are aligned on the pixel circuit layer in each of the plurality of openings by an electric field formed between the first electrode and the second electrode.

17. The display device according to claim 15, wherein a lateral width and a longitudinal width of each of the plurality of openings are greater than a length of each of the plurality of the light emitting elements.

18. The display device according to claim 17, wherein the first electrode and the second electrode overlap the bank in the emission area of each of the plurality of sub-pixels.

* * * * *